United States Patent
Watanabe

(10) Patent No.: US 8,743,088 B2
(45) Date of Patent: Jun. 3, 2014

(54) POINTING DEVICE COMPRISING A LIGHT CONTROL PART AND ELECTRONIC APPARATUS COMPRISING AN INPUT DEVICE

(75) Inventor: Takahiro Watanabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 718 days.

(21) Appl. No.: 12/868,442

(22) Filed: Aug. 25, 2010

(65) Prior Publication Data

US 2011/0115705 A1    May 19, 2011

(30) Foreign Application Priority Data

Nov. 17, 2009    (JP) .................... 2009-262342

(51) Int. Cl.
| | |
|---|---|
| *G06F 3/042* | (2006.01) |
| *G06F 3/041* | (2006.01) |
| *G02B 5/02* | (2006.01) |
| *H01L 33/00* | (2010.01) |
| *G06M 7/00* | (2006.01) |
| *G06F 3/0354* | (2013.01) |

(52) U.S. Cl.
CPC ............ *G06F 3/0421* (2013.01); *G06F 3/0428* (2013.01); *G06F 2203/04109* (2013.01); *G06F 3/03547* (2013.01); *G06F 2203/04103* (2013.01); *H03K 2217/96042* (2013.01)
USPC ........... 345/175; 345/173; 359/599; 362/612; 257/98; 257/99; 257/100; 250/221; 250/205

(58) Field of Classification Search
CPC ...... G06F 3/042; G06F 3/0421; G06F 3/0428
USPC ........ 345/166, 173, 175; 250/221; 178/18.03, 178/18.09, 18.11
See application file for complete search history.

(56) References Cited

U.S. PATENT DOCUMENTS

| | | | | |
|---|---|---|---|---|
| 5,732,148 | A * | 3/1998 | Keagy et al. .................. | 382/124 |
| 6,355,937 | B2 | 3/2002 | Antonelli et al. | |
| 2001/0050765 | A1* | 12/2001 | Antonelli et al. ................ | 356/71 |
| 2005/0179064 | A1* | 8/2005 | Nawashiro et al. ........... | 257/257 |
| 2007/0045644 | A1* | 3/2007 | Han et al. ......................... | 257/98 |
| 2007/0063130 | A1 | 3/2007 | Ahn et al. | |
| 2007/0146318 | A1* | 6/2007 | Juh et al. ........................ | 345/157 |
| 2010/0060578 | A1* | 3/2010 | Chen et al. ..................... | 345/161 |

FOREIGN PATENT DOCUMENTS

| | | |
|---|---|---|
| JP | 2007-528554 A | 10/2007 |
| JP | 2008-507787 A | 3/2008 |

* cited by examiner

*Primary Examiner* — Dwayne Bost
*Assistant Examiner* — Nalini Mummalaneni
(74) *Attorney, Agent, or Firm* — Birch, Stewart, Kolasch & Birch, LLP

(57) ABSTRACT

A pointing device including a touching surface, a light emitting diode, an imaging element, and a first light control part. A fingertip is placed on the touching surface. The light emitting diode illuminates the touching surface from a side opposite to a side where the fingertip is placed. The imaging element receives light reflected from the fingertip. The first light control part controls light, which is emitted from the light emitting diode and reaches the touching surface, so that the light is evenly incident to the touching surface. The pointing device improves detection accuracy and prevents malfunctions, even when there is deviation in an output from a light source. In addition, an electronic apparatus including an input device can be provided.

8 Claims, 21 Drawing Sheets

CONVENTIONAL TECHNOLOGY

CONVENTIONAL TECHNOLOGY

CONVENTIONAL TECHNOLOGY

CONVENTIONAL TECHNOLOGY

CONVENTIONAL TECHNOLOGY

CONVENTIONAL TECHNOLOGY

POINTING DEVICE COMPRISING A LIGHT CONTROL PART AND ELECTRONIC APPARATUS COMPRISING AN INPUT DEVICE

This Nonprovisional application claims priority under 35 U.S.C. §119(a) on Patent Application No. 2009-262342 filed in Japan on Nov. 17, 2009, the entire contents of which are hereby incorporated by reference.

TECHNICAL FIELD

The present invention relates to a pointing device that can be mounted on a portable information terminal such as a mobile phone, and to an electronic apparatus including the pointing device. In particular, the present invention relates to a technique for improving decrease in detection accuracy due to deviation of output of a light source.

BACKGROUND ART

Recently, some of portable information terminals such as mobile phones and PDAs (Personal Digital Assistants) are designed such that a display section can display graphics, and GUI (Graphical User Interface) which uses the display section in two-dimension is employed as a method for displaying information to users. However, as the portable information terminals have higher performances and become closer to display performances of computers, there arises a problem that the portable information terminals require complicate operations.

In general, the portable information terminals employ a keypad as a user interface via which information is entered. A keypad consists of a plurality of keys via which numerals and characters are entered, and direction keys. However, under the aforementioned circumstance in which the portable information terminals require complicated operations, an input using menu keys and other function keys of a keypad as direction keys is not suitable for selection of icons displayed by a GUI, and consequently a desired operation cannot be performed easily. Therefore, it is difficult to employ the input using the keypad as direction keys for the portable information terminals. Accordingly, the portable information terminals are required to mount pointing devices having the same operativity as those of mice and touch pads used for computers.

Under such circumstance, as pointing devices that can be mounted on portable information terminals, there has been proposed a pointing device which observes, by an imaging element, a pattern of an object such as a fingertip touching the pointing device and detects the change in the pattern of the object on the touching interface, so as to detect the movement of the object. Further, there has been proposed a pointing device which irradiates a touching interface with a light source, causes a pattern of an object on the touching interface to be focused on an imaging element via a lens, and detects a change in the pattern, so as to convert the movement of the object into an input signal and detect the movement.

Conventional examples of such pointing devices include pointing devices disclosed in Patent Literatures 1 and 2 below.

The pointing device disclosed in Patent Literature 1 includes a cover glass, a light source section, and a light receiving section. The light source section includes a light source and a light source guide consisting of a plurality of reflecting mirrors provided above the light source. Light emitted from the light source is reflected by a reflecting mirror by a predetermined angle, and is incident to the cover glass. The light incident to the cover glass is reflected by a surface of a finger, and the light reflected by the surface of the finger is incident to the light receiving section. The light receiving section includes a reflecting mirror, a condensing lens, and a light image sensor. The light incident to the light receiving section is reflected by the reflective mirror, imaged by the condensing lens, and is incident to the light image sensor.

The pointing device disclosed in Patent Literature 2 includes a light source for irradiating an object with light, a collimating lens for subduing diffusion of the light from the light source, a reflective surface for reflecting the light from the collimating lens by a predetermined angle so that the reflected light goes toward an image acquiring surface, the image acquiring surface, an imaging element for condensing an image from the image acquiring surface, and a light sensor for receiving the condensed image and converting it to an electric signal.

CITATION LIST

Patent Literature

[Patent Literature 1]
Japanese Translation of PCT International Application, Tokuhyo, No. 2008-507787 (published on Mar. 13, 2008)
Japanese Translation of PCT International Application, Tokuhyo, No. 2007-528554 (published on Oct. 11, 2007)

SUMMARY OF INVENTION

Technical Problem

However, the conventional pointing devices suffer from a problem that when there exists a deviation in light intensity on a touching surface, it is impossible to accurately detect the movement of an object, resulting in malfunction.

The following discusses this problem with reference to FIGS. 29-32. FIG. 29 is a cross sectional drawing illustrating a configuration of a conventional pointing device 500. FIG. 30(a) is a drawing illustrating even distribution of light intensity on a touching surface 503. FIG. 30(b) is a drawing illustrating deviated distribution of light intensity on the touching surface 503. FIG. 31(a) a drawing illustrating light intensity of an even contrast pattern on the touching surface 503. FIG. 31(b) is a drawing illustrating light intensity of a deviated contrast pattern on the touching surface 503. FIG. 32 is a drawing illustrating a relationship between light intensity and an emission angle of a light source 501.

As shown in FIG. 29, the conventional pointing device 500 is designed such that an illuminating optical system thereof ranging from the light source 501 to the touching surface 503 includes the light source 501, reflective mirrors 504 and 505 provided above the light source 501, and a touching surface 503, and that an imaging optical system thereof ranging from the touching surface 503 to an imaging element 502 includes a reflective mirror 506 provided under the touching surface 503, a first wave guide tube 508, a second wave guide tube 509, a reflective mirror 507, and an imaging element 502.

In the conventional pointing device 500, the imaging element 502 receives a contrast pattern reflecting a pattern of a fingerprint, based on distribution of light intensity on the touching surface 503 before the touching surface 503 is touched with a fingertip. Then, the imaging element 502 detects a movement (change) of the contrast pattern so as to detect the movement of the fingertip. When distribution of light intensity on the touching surface 503 is even as illustrated in FIG. 30(a), the imaging element 502 receives a contrast pattern with light intensity illustrated in FIG. 31(a) as a contrast pattern reflecting a pattern of a fingerprint.

A light emitting element such as a LED and a laser diode is used as the light source 501. As shown in FIG. 32, such light emitting element outputs light with intensity deviated with respect to an emission angle. Consequently, as shown in FIG. 30(b), distribution of light intensity on the touching surface 503 gets uneven. In this case, the imaging element 502 receives a contrast pattern with light intensity shown in FIG. 31(b) as the contrast pattern reflecting the fingerprint. That is, the imaging element 502 receives a contrast pattern whose light intensity of a contrast is uneven. Since the contrast pattern has a bright area whose light intensity is lower than that of a dark area, the imaging element 502 cannot detect the movement of the fingertip, resulting in malfunction.

Therefore, it is necessary to design the illuminating optical system from the light source 501 to the touching surface 503 such that light as even as possible is emitted to the touching surface 503. Accordingly, the conventional pointing device 500 is designed to make light intensity of light with which the touching surface 503 is irradiated even by using partial radiation angles θ 520 having similar light intensities as illustrated in FIG. 32. However, such design does not allow efficient use of light.

Another problem is a problem of stray light. That is, although the light source 501 is for emitting light to the touching surface 503, some part of the light from the light source 501 is directly emitted to the imaging element 502 without via the touching surface 503, resulting in deviation in the pattern received by the imaging element 502.

Accordingly, in the illuminating optical system of the conventional pointing device 500, only a part of the light from the light source 501 is used. Further, since the light from the light source 501 is attenuated when it is reflected by the reflecting mirrors 505 and 506, the conventional pointing device 500 requires a large amount of power in order to secure a necessary amount of light. Further, the reflecting mirrors 505 and 506 cannot be downsized due to the size of the touching surface 503 to which the reflecting mirrors 505 and 506 are required to emit light. This makes it difficult to downsize the pointing device 500.

Further, in order to eliminate stray light, it is necessary to provide an eliminating section. In the conventional pointing device 500, a shielding film 510 is provided as the eliminating section between the first wave guide tube 508 and the second wave guide tube 509 in order to solve a problem that light with angles other than the radiation angles θ 520 becomes stray light. However, this configuration requires two wave guide tubes, and consequently requires more number of components. This also makes it difficult to downsize the conventional pointing device 500.

The present invention was made in view of the foregoing problems. An object of the present invention is to provide a pointing device in which the decrease in detection accuracy due to deviation in an output from a light source is improved and thus malfunction is prevented, and an electronic apparatus including the pointing device. Another object of the present invention is to provide a pointing device in which stray light is eliminated by a simple configuration that does not result in growth in size, and an electronic apparatus including the pointing device.

Solution to Problem

In order to solve the foregoing problem, a pointing device of the present invention includes: a touching surface on which an object is placed; a light emitting element for illuminating the touching surface from a side opposite to a side where the object is placed; and an imaging element for receiving light reflected from the object, the pointing device further comprising first light control means for controlling light which is emitted from the light emitting element and reaches the touching surface so that the light is evenly incident to the touching surface, the light emitting element emitting light whose light intensity is deviated with respect to a radiation angle, and the first light control means being positioned on a light path from the light emitting element to the touching surface.

With the arrangement, the first light control means is positioned on a light path from the light emitting element to the touching surface. Consequently, distribution of light intensity of light emitted to the touching surface can be made even, even when an output of the light emitting element is deviated. This allows improving detection accuracy and preventing malfunction.

In order to solve the foregoing problem, an electronic apparatus of the present invention includes the pointing device as an input device.

With the arrangement, the electronic apparatus includes the pointing device designed to be thin and to prevent malfunction. Accordingly, the electronic apparatus can be thin and small, and consumes only low power.

Advantageous Effects of Invention

As described above, the pointing device of the present invention further includes first light control means for controlling light which is emitted from the light emitting element and reaches the touching surface so that the light is evenly incident to the touching surface, the light emitting element emitting light whose light intensity is deviated with respect to a radiation angle, and the first light control means being positioned on a light path from the light emitting element to the touching surface.

Since the first light control means is positioned on a light path from the light emitting element to the touching surface, distribution of light intensity of light emitted to the touching surface can be made even, even when an output of the light emitting element is deviated. This allows improving detection accuracy and preventing malfunction.

Further, since the electronic apparatus of the present invention includes, as an input device, the pointing device designed to be thin and to prevent malfunction, the electronic apparatus can be thin and small, and consumes only low power.

DESCRIPTION OF EMBODIMENTS

The following explains embodiments of the present invention with reference to drawings. Initially, explanations are made as to comparative examples on which the present invention is based. There are four comparative examples, and each one is designed to be thin in thickness. Examples of the present invention will be explained after the explanations of the comparative examples.

Figure 1:
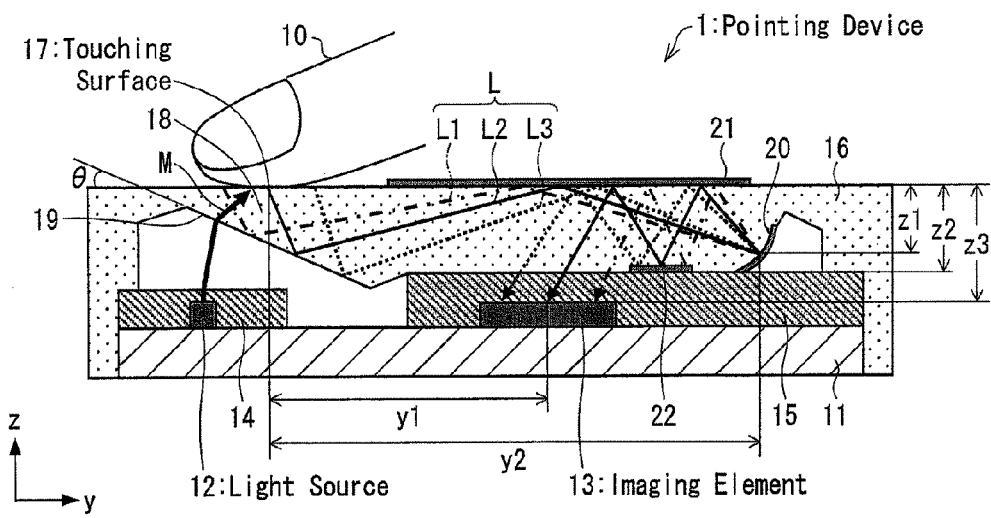
FIG. 1 is a cross sectional drawing showing a configuration of a thin pointing device in accordance with First Comparative Example.

Hereinafter, for convenience of explanation, a direction normal to a plane of FIG. 1 is regarded as an x-axis, a lateral direction on the plane of FIG. 1 is regarded as a y-axis, and a longitudinal direction on the plane of FIG. 1 is regarded as a z-axis, and the longitudinal direction on the plane of FIG. 1 is regarded as being equal to a longitudinal direction of a pointing device. In the specification, the terms "parallel" and "even" indicate not only exactly parallel and exactly even, but also ranges considered as substantially parallel and substantially even.

Comparative Example 1

(1-1) Configuration

FIG. 1 is a cross sectional drawing a configuration of a thin pointing device 1 in accordance with a first Comparative Example.

A pointing device 1 is a device for detecting input of user's instruction by optically detecting a change of a pattern of a fingertip 10 touching a touching surface 17 of a cover section 16 and thus detecting a movement of the fingertip 10. The fingertip 10 is an object whose movement is to be detected by the pointing device 1. The object is not limited to the fingertip 10 and may be any optically readable object. In FIG. 1, the fingertip 10 is written in a small size relative to the pointing device 1 in order to clearly show the state of the fingertip 10.

As illustrated in FIG. 1, the pointing device 1 includes a circuit substrate 11, a light source 12, an imaging element 13, a resin mold section 14, a resin mold section 15, and a cover section 16.

A wiring pattern (not illustrated) and a terminal connectable with an outside component (not illustrated) are formed on the circuit substrate 11. The light source 12 and the imaging element 13 are mounted on one surface of the circuit substrate 11 (this surface is hereinafter referred to as a mounting surface) so that the light source 12 and the imaging element 13 are electrically connected with the wiring pattern and the terminal.

Examples of the light source 12 include a light emitting diode and a semiconductor laser. The light source 12 is for emitting light to the touching surface 17 of the cover section 16. That is, the light source 12 is for emitting light to the fingertip 10. The light source 12 is sealed with the resin mold section 14.

The imaging element 13 is an image sensor such as a CMOS and a CCD. The imaging element 13 receives light reflected by the touching surface 17 of the cover section 16, forms an image on the touching surface 17 based on the received light, and converts the image into image data. When there is no object on the touching surface 17, the imaging element 13 forms an image of the touching surface 17 itself. When there is an object on the touching surface 17, the imaging element 13 forms an image of a surface of the object on the touching surface 17. The surface of the fingertip 10 of the object is not limited to a fingerprint and may be covered by bandage or a glove since a pattern of the bandage or the glove also can be read by the imaging element 13. The imaging element 13 continues to capture an image of the touching surface 17 at a certain interval in accordance with instructions from an external control section etc.

Further, the imaging element 13 includes a DSP (Digital Signal Processor: calculating section) (not shown) and takes generated image data into the DSP. The DSP of the imaging element 13 calculates the change in data of the image captured by the imaging element 13. The result of the calculation indicates the amount of movement of the object and a direction in which the object moves, and is output to an external control section via the circuit substrate 11. The imaging element 13 is sealed by the resin mold section 15.

The resin mold section 14 and the resin mold section 15 are provided separately. This prevents light from the light source 12 to leak into the imaging element 13 via the resin, preventing malfunction due to incidence of the light from the light source 12 to the imaging element 13. A preferable example of resin used for the resin mold section 14 and the resin mold section 15 is resin made of epoxy, silicone, or acryl having high transmissivity. Sealing may be carried out by transfer molding which is generally carried out, or other molding such as inkjet molding and potting.

The cover section 16 is for covering the mounting surface of the circuit substrate 11 so as to include and protect individual members on the mounting surface, for receiving an input by the fingertip 10, and for guiding reflected light to the imaging element 13. The cover section 16 is provided on and fixed to the circuit substrate 11 while the cover section 16 is attached to the top surfaces of the resin mold sections 14 and 15 serving as a positional reference. The cover section 16 and the circuit substrate 11 form the outer hull of the pointing device 1. The pointing device 1 has a rectangular parallelepiped shape, which allows the pointing device 1 to be thin. Alternatively, the pointing device 1 may have a cubic shape for example.

The cover section 16 includes an internal surface which forms an internal space with the mounting surface of the circuit substrate 11 and an external surface which is exposed to outside when the cover section 16 is fixed to the circuit substrate 11. On the internal surface of the cover section 16, there are provided a prism 18 having an inclined surface 19, a reflective lens 20, and a reflective surface 22. On the external surface of the cover section 16, a touching surface 17 and a reflective surface 21 are provided.

The touching surface 17 is a portion at which an image of the fingertip 10 is captured, and is positioned above the prism 18 constituting a part of the cover section 16 and above the light source 12. The fingertip 10 which is an object touches the touching surface 17 when a user uses the pointing device 1. Light emitted to the touching surface 17 is scattered on and reflected by the surface of the fingertip 10.

The prism 18 constitutes a part of the cover section 16, and is positioned above the light source 12 and below the touching surface 17. The prism 18 has the inclined surface 19. As a result of a function of the prism 18, the inclined surface 19 transmits light emitted from the light source 12 and wholly reflects light indicative of the fingertip 10 inside the cover section 16. This configuration allows the pointing device 1 to emit light to the touching surface 17 while guiding light reflected by the touching surface 17 inside the cover section 16 (toward a y-axis direction). The light wholly reflected by the inclined surface 19 travels toward the reflective surface 21. Since the inclined surface 19 is designed to wholly reflect the light reflected by touching surface 17, an aluminum reflective film etc. is not deposited on the inclined surface 19.

The reflective lens 20 is an imaging element for reflecting light which has been reflected by the fingertip 10 and is traveling in the cover section 16, so as to form an image of the fingertip 10 on the imaging element 13. The reflective lens 20 is provided diagonally above the imaging element 13. The reflective lens 20 has a troidal surface in which curvatures in two orthogonal directions are different. The reflective lens 20 reflects light on the troidal surface so that an image of the reflected light is formed on the imaging element 13. Further, in order to enable the reflective lens 20 to reflect light efficiently, a reflective film made of a metal (e.g. aluminum, nickel, gold, and silver) or a dielectric dichroic film is deposited on the troidal surface of the reflective lens 20.

The reflective surface 21 is for reflecting the light wholly reflected by the inclined surface 19 and causing the light to be incident to the reflective lens 20, and for reflecting the light reflected by the reflective lens 20 so that the light is incident to the imaging element 13. The reflective surface 21 is positioned above the imaging element 13. In order to enable the reflective surface 21 to reflect light efficiently, a reflective film made of a metal (e.g. aluminum, nickel, gold, and silver) or a dielectric dichroic film is deposited on the reflective surface 21.

The reflective surface 22 is for reflecting the light reflected by the reflective lens 20 and the reflective surface 21 in this order, so that the light reflected by the reflective surface 22 travels toward the reflective surface 21 again. The reflective surface 22 is positioned above the imaging element 13 and between the imaging element 13 and the reflective lens 20. In order to enable the reflective surface 22 to reflect light efficiently, a reflective film made of a metal (e.g. aluminum, nickel, gold, and silver) or a dielectric dichroic film is deposited on the reflective surface 22.

Figure 7:
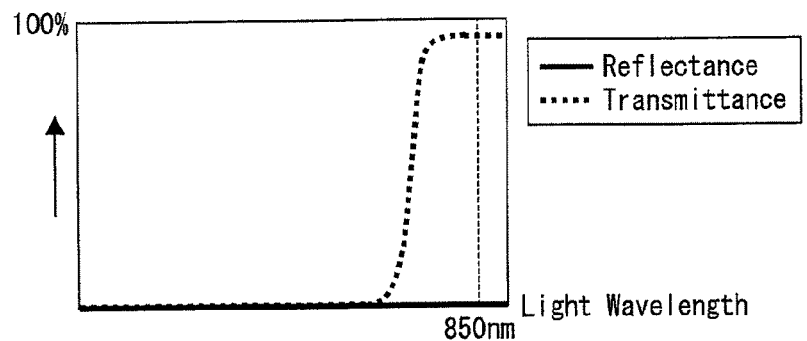
FIG. 7(a) is a drawing showing a relationship reflectance and a wavelength of light and a relationship between transmittance and the wavelength of light.
FIG. 7(b) is a drawing showing a relationship reflectance and a wavelength of light and a relationship between transmittance and the wavelength of light.
FIG. 7(c) is a drawing showing a relationship reflectance and a wavelength of light and a relationship between transmittance and the wavelength of light.
Figure 7:
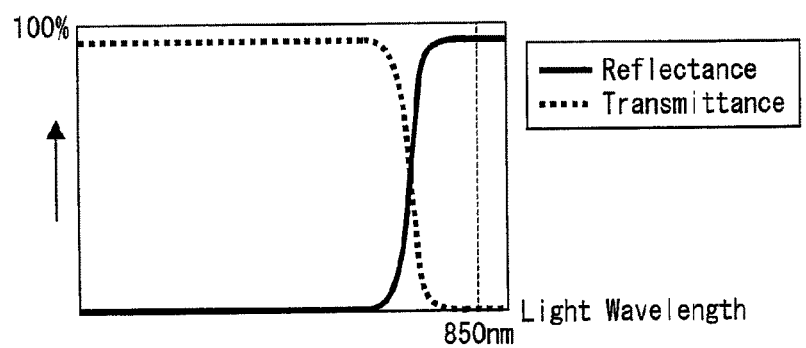
Figure 7:
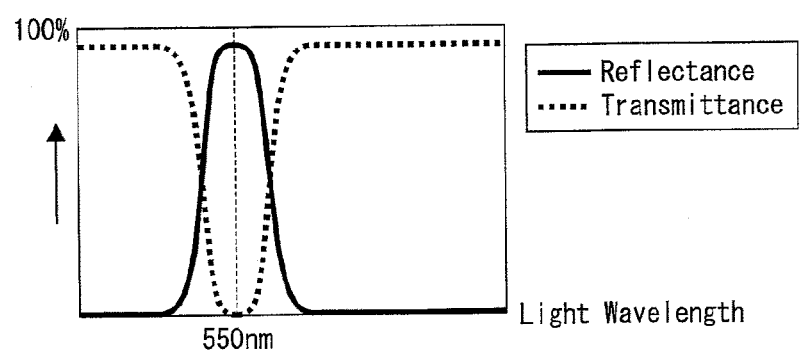

Since the external surface of the cover section 16 is clearly seen by a user, it is desirable that the reflective surface 21 is as indistinctive as possible in terms of its external surface. Accordingly, it is desirable that the wavelength of light from the light source 12 is set to a wavelength of infrared light (e.g. 800 nm or more) which is beyond a wavelength of visible light, and a reflective film used as the reflective surface 21 is an infrared reflective film which reflects infrared coming from the light source 12. An example of the infrared reflective film is a reflective film (surface coating film) which reflects infrared light with a waveband of 800 nm or more and transmits light with a visible waveband of 800 nm or less, as shown in FIG. 7(b). FIGS. 7(a) to 7(c) are drawings showing a relationship between a reflectance and a transmittance with respect to a wavelength of light. In FIGS. 7(a) to 7(c), a lateral axis indicates a wavelength (nm), a longitudinal axis indicates a transmittance and a reflectance (%), a dotted line indicates a transmittance, and a full line indicates a reflectance.

As described above, by appropriately setting the wavelength of light from the light source 12 and the reflectance and the transmittance of the reflective film serving as the reflective surface 21, it is possible to provide the reflective surface 21 which efficiently reflects light reflected by the fingertip 10 and is indistinctive.

Further, it is desirable that the cover section 16 is made of a material which transmits only infrared as shown in FIG. 7(a). Examples of the material include polycarbonate resin and acrylic resin which absorb visible light. When the material is used, the property of the material enables the cover section 16 to block a visible light component of unnecessary light coming from the outside, and the reflective film of the reflective surface 21 blocks an infrared component of the unnecessary light. This allows preventing malfunction due to incidence of unnecessary light from the outside to the imaging element 13.

When coloring the external surface of the cover section 16, it is desirable that, as shown in FIG. 7(c), the infrared reflective film is coated with a coating material which reflects light with a particular waveband indicative of a desired color (green in FIG. 7(c)) and transmits light with other wavelength. This allows giving the desired color to the external surface of the cover section 16 without impairing the optical characteristic of the pointing device 1.

(1-2) Detection Operation

The following explains a detection operation of the pointing device 1 having the above configuration.

Light emitted from the light source 12 is transmitted in the resin mold section 14 and is transmitted and deflected in the inclined surface 19 of the cover section 16 and reaches the touching surface 17. At that time, the light emitted from the light source 12 illuminates the touching surface 17 from a side opposite to a side where the fingertip 10 is placed and from a diagonal direction indicated by an optical axis M of the illuminating optical system (at a certain incidence angle with respect to the touching surface 17). When the fingertip 10 that is an object touches the touching surface 17, the light with the optical axis M which diagonally illuminates the touching surface 17 is scattered and reflected on the surface of the fingertip 10.

The light scattered and reflected on the surface of the fingertip 10, i.e. light L indicative of an image of the fingertip 10 is incident to the prism 18 and is wholly reflected by the inclined surface 19 and then reflected by the reflective surface 21, the reflective lens 20, the reflective surface 21, the reflective surface 22, and the reflective surface 21 in this order, and then focused on the imaging element 13. Then, the image focused on the imaging element 13 is taken as image data into the DSP.

The imaging element 13 continues to capture an image of the touching surface 17 at a certain interval. When the fingertip 10 on the touching surface 17 moves, an image captured at that time has a certain amount of difference from an image captured right before that time. The DSP compares the amount of difference in the same area between the two images, and thus extracts a movement of the fingertip 10 and acquires the amount of the movement of the fingertip 10 and a direction in which the fingertip 10 moves. Thus, the imaging element 13 can detect the movement of the fingertip 10. The DSP may be provided not in the imaging element 13 but on the circuit substrate 11. In this case, the imaging element 13 sequentially outputs captured image data to the circuit substrate 11.

As described above, in the pointing device 1, light guiding operations, i.e. incidence of light reflected from the fingertip 10, whole reflection of light in a light guiding direction, and emission of light from the reflective lens 20 to an imaging surface of the imaging element 13, are carried out in the same light guiding member (i.e. cover section 16). Consequently, the pointing device 1 can be made greatly thinner, does not suffer from variations in assembly of members, and it is possible to prevent scattering reflection and attenuation generated at an interface between different media. This secures stable optical performance, resulting in great reduction in costs.

Further, the pointing device 1 is configured such that the imaging element 13 is positioned between the prism 18 which is a deflecting element and the reflective lens 20 which is a focusing element, and light reflected by the fingertip 10 and travels in the cover section 16 is reflected by the reflective lens 20 so that the light go against the direction in which the light has traveled, and then the light is focused on the imaging element 13. This configuration allows the pointing device 1 to have an optical system in which differences in light path length among light L1 coming from the uppermost left on the FIG. 1 paper, light L2 coming from the center on the FIG. 1 paper, and light L3 coming from the uppermost right on the FIG. 1 paper are made small. Consequently, defocus of the light L1, L2, and L3 in a light guiding direction on a plane of the imaging element 13 is less likely to occur, increasing a focusing performance and making an image of a finger clear.

Further, in the pointing device 1, the touching surface 17 and the imaging surface of the imaging element 13 are positioned parallel to each other, and use of the reflective lens 20 as the imaging element allows differences among light path lengths of lights L1, L2, and L3 to be small. This allows easily making the pointing device 1 thinner.

Further, the prism 18, the inclined surface 19, and the reflective lens 20 may be formed integrally with the cover section 16. This allows reducing the thickness of the pointing device 1 as a whole. Further, integrally forming the cover section 16, the prism 18, the inclined surface 19, and the reflective lens 20 by using a mold for the cover section 16 allows the inclined surface 19 and the reflective lens 20 to be positioned with high accuracy without any variations.

(1-3) Specific Example

The following explains an example of specific numerals for the pointing device 1 having the above configuration.

Reflectance of visible light absorbing polycarbonate resin which is a material of the cover section 16: 1.59

Narrow inclination angle θ formed by inclined surface 19 and touching surface 17: 24°

Thickness z2 of cover section 16 ranging from reflective surface 21 to reflective surface 22: 0.5 mm Length y2 on y-axis ranging from the center of touching surface 17 to the center of troidal surface of reflective lens 20: 2.8 mm Length z1 on z-axis ranging from the center of touching surface 17 to the center of troidal surface of reflective lens 20: 0.38 mm Length y1 on y-axis ranging from the center of touching surface 17 to the center of imaging element 13: 1.4 mm Length z3 on z-axis ranging from the center of touching surface 17 to the center of the imaging element 13: 0.62 mm The reflective lens 20 has a troidal surface in which a x-y cross section is spherical (curvature radius: −2.5644773 mm) and a y-z cross section is aspherical. The aspherical shape is represented by Equation 1 below which is an aspherical equation.

$$Z = \frac{RY^2}{1 + \sqrt{1 - (1+K)R^2Y^2}} + AY^2 + BY^4 + CY^6 + DY^8. \quad \text{Equation (1)}$$

In the equation, K represents a conic constant, R represents a curvature radius, and A, B, C, and D represent second, fourth, sixth, and eighth aspherical coefficients, respectively. Further, Z represents a length of a normal from a point which is on an aspherical surface and is away from an optical axis by a distance Y to a tangent plane at an apex of the aspherical surface (plane perpendicular to the optical axis). Values of the constants are as follows.

K=0
R=−2.75963
A=0.0041215677
B=0.0042418757
C=0.0066844763
D=−0.084438065

Comparative Example 2

The following explains a second Comparative Example. Note that a configuration which is not described in the present example is identical to the configuration described in the Comparative Example 1. For convenience of explanation, members having the same functions as those shown in the drawings of the Comparative Example 1 are given the same reference signs and explanations thereof are omitted here. The same is true for later-mentioned Comparative Examples.

(2-1) Configuration and Detection Operation

Figure 2:
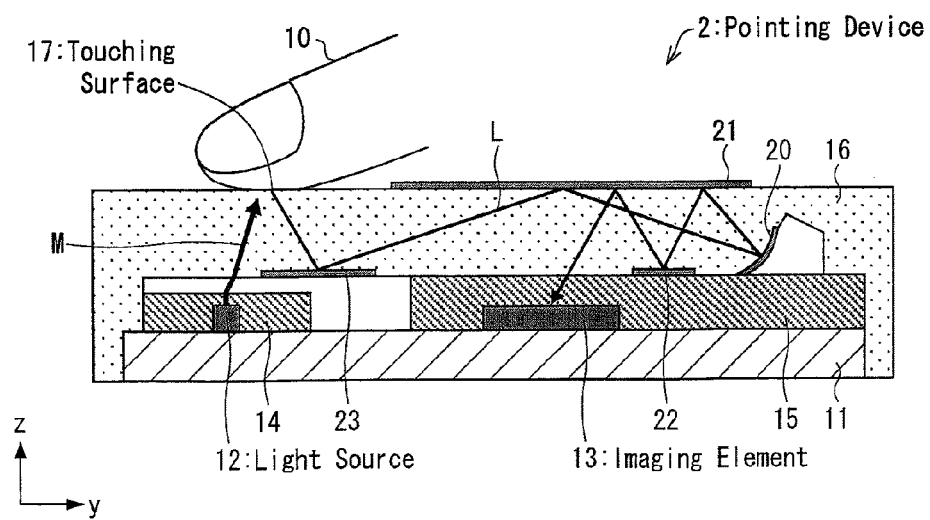
FIG. 2 is a cross sectional drawing showing a configuration of a thin pointing device in accordance with Second Comparative Example.

FIG. 2 is a cross sectional drawing illustrating a configuration of a thin pointing device 2 in accordance with Second Comparative Example.

As illustrated in FIG. 2, the pointing device 2 is different from the pointing device 1 of Comparative Example 1 in that the prism 18 and the inclined surface 19 in the cover section 16 is replaced with a diffraction element 23.

The diffraction element 23 is positioned above a light source 12 and below a touching surface 17. The diffraction element 23 is for reflecting light reflected by a fingertip 10 so that the light path is changed toward a reflective surface 21 inside the cover section 16. The light reflected by the diffraction element 23 travels toward the reflective surface 21.

An optical system of the pointing device 2 includes a light source 12 for illuminating the fingertip 10 whose image is to be captured, the touching surface 17 which the fingertip 10 touches, the diffraction element 23, a reflective lens 20, the reflective surface 21, a reflective surface 22, and an imaging element 13. Namely, in the pointing device 1 shown in FIG. 1, reflected light from the fingertip 10 is wholly reflected by the inclined surface 19 formed by the prism 18 so that the reflected light is focused on the imaging element 13, whereas in the pointing device 2 shown in FIG. 2, the reflected light from the fingertip 10 is diffracted by the diffraction element 23.

Consequently, in the pointing device 2, an image of a fingerprint formed mainly when the fingertip 10 touches the touching surface 17 is reflected and diffracted by the diffraction element 23 toward the reflective surface 21 as indicated by an optical axis L in an imaging optical system. The diffracted light from the diffraction element 23 is reflected by the reflective surface 21 and by the reflective lens 20, and then again by the reflective surface 21, the reflective surface 22, and the reflective surface 21, in this order, so that an image of the light is focused on the imaging element 13.

As described above, the pointing device 2 using the diffraction element 23 for bending the optical axis is capable of realizing more even thickness of the cover section 16 compared with the case of the pointing device 1 shown in FIG. 1 in which the prism 18 is provided in the cover section 16. Consequently, it is possible to make the pointing device thinner while increasing the strength of the cover section 16, and to emit the light from the light source 12 so that the light travels with an even light intensity toward a direction where the touching surface 17 is provided.

(2-2) Diffraction Element

With reference to FIGS. 5(a) to 5(e), the following explains a specific shape of the diffraction element 23. FIG. 5(a) is a cross sectional drawing schematically showing a shape of the diffraction element 23, and FIGS. 5(b) to 5(e) are top drawings showing examples of a configuration of the diffraction element 23.

The diffraction element 23 is a reflective diffraction element using +1 order reflective diffraction light. It is desirable that the reflective diffraction element has a blazed shape in terms of a cross sectional shape as shown in FIG. 5(a) in order that +primary light is produced more strongly. This increases usage efficiency of light and prevents deterioration in imaging performance of the optical system because 0 order diffraction light, −1 order diffraction light, or higher order diffraction light which becomes stray light is prevented.

Further, in order to increase reflectance, it is desirable that on external surface of the diffraction element 23 is deposited a reflective film a1 (e.g. aluminum, silver, gold, and dialectic dichroic film). A groove depth t of the diffraction element 23 is desirably a depth that allows +1 order diffraction efficiency to be highest. For example, when reflectance of the cover section 16 is n and a wavelength of emitted light is λ, it is desirable that t=λ/2n.

Figure 5:
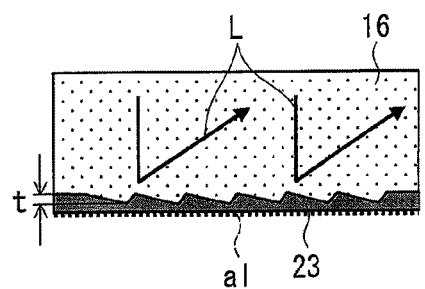
FIG. 5(a) is a cross sectional drawing schematically showing a shape of a diffraction element in the pointing device shown in FIG. 2.
FIG. 5(b) is a top drawing showing a configuration example of the diffraction element.
FIG. 5(c) is a top drawing showing a configuration example of the diffraction element.
FIG. 5(d) is a top drawing showing a configuration example of the diffraction element.
FIG. 5(e) is a top drawing showing a configuration example of the diffraction element.
Figure 5:
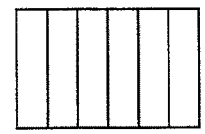
Figure 5:
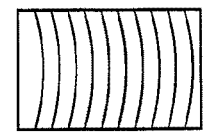
Figure 5:
Figure 5:
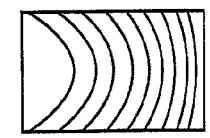

The groove pattern of the diffraction element 23 consists of lines with a constant pitch as shown in FIG. 5(*b*). It is desirable that the pitch is as small as possible in order to make a diffraction angle as large as possible. In terms of cost, subjecting a mold to a cutting process using a cutting tool to give grooves to the mold and molding the diffraction element 23 is most advantageous. Accordingly, in consideration of the range within which a cutting process is accurately performed, it is desirable that the groove pitch of the diffraction element 23 ranges from 0.8 to 3.0 μm.

Further, when the groove pattern of the diffraction element 23 consists of curves as shown in FIG. 5(*c*) in order to improve performance of imaging the fingertip 10 on the imaging element 13, it is possible to correct distortion of the image. Further, the groove pattern of the diffraction element 23 may be arranged to be a pattern in which the groove pitch is not a constant pitch but gradually changes as shown in FIG. 5(*d*) so as to exert a lens effect in one direction. In this case, it is possible to correct aberration on the imaging element 13 due to a difference in focal distance between an x-axis direction and a y-axis direction. Further, as shown in FIG. 5(*e*), when the groove pattern of the diffraction element 23 consists of curves with different pitches, it is possible to correct both distortion of an image and astigmatism.

Figure 6:
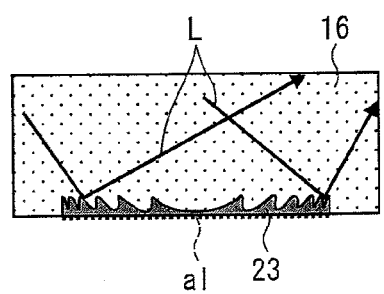
FIG. 6 is a cross sectional drawing schematically showing another shape of the diffraction element.

Further, another specific example of the diffraction element 23 is a Fresnel lens. FIG. 6 specifically shows the shape of a Fresnel lens. FIG. 6 is a cross sectional drawing schematically showing the shape of the diffraction element 23 which is a Fresnel lens.

As shown in FIG. 6, the cross sectional shape of the Fresnel lens is a blazed shape. In order to improve reflectance, it is desirable that a reflective film a1 (e.g. aluminum, silver, gold, and dielectric dichroic film) is deposited on an external surface of the diffraction element 23. When the lens of the diffraction element 23 is a Fresnel lens, it is possible to make the thickness of the cover section 16 even, compared with a case where a prism or a bulk lens is formed at a part of the cover section 16. Consequently, it is possible to design the pointing device 2 to be thinner while increasing the strength of the cover section 16.

The diffraction element 23 is not limited to the above. For example, when a hologram lens is used as the diffraction element 23, it is possible to correct aberration which cannot be completely corrected by a normal lens. Accordingly, the hologram lens serving as the diffraction element 23 increases imaging performance, clearly focusing an image of the fingertip 10 on the imaging element 13.

Comparative Example 3

(3-1) Configuration and Detecting Operation

Figure 3:
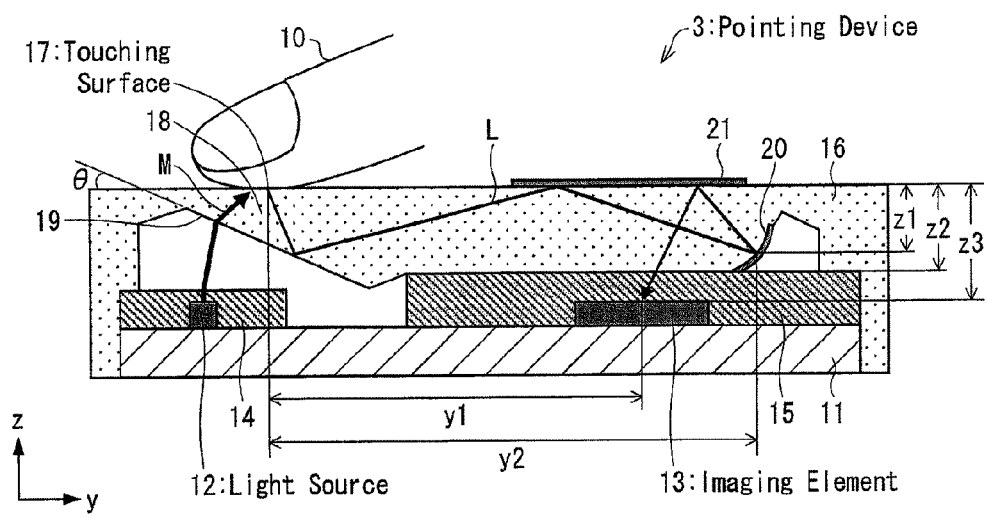
FIG. 3 is a cross sectional drawing showing a configuration of a thin pointing device in accordance with Third Comparative Example.

FIG. 3 is a cross sectional drawing showing a configuration of a thin pointing device 3 in accordance with Third Comparative Example.

As shown in FIG. 3, a pointing device 3 is obtained by removing the reflective surface 22 from the cover section 16 of the pointing device 1 of Comparative Example 1. That is, the pointing device 3 is different from the pointing device 1 of Comparative Example 1 in that the pointing device 3 does not have the reflective surface 22.

Since the pointing device 3 does not have the reflective surface 22, reflected light from the fingertip 10 is wholly reflected by the inclined surface 19 of the prism 18 toward a y-axis direction, and is reflected by the reflective surface 21, the reflective lens 20, and the reflective surface 21 in this order, and is incident to the imaging element 13.

Accordingly, reflection of light reflected by the reflective lens 20 before the light is incident to the imaging element 13 is only one at the reflective surface 21. This reduces the influence of a loss of light on a light-reflecting surface. This allows increasing usage efficiency of light and designing a light path length to be comparatively short, realizing a brighter optical system.

The pointing device 3 was obtained from the pointing device 1 of Comparative Example 1. Alternatively, the pointing device 3 may be obtained from the pointing device 2 of Comparative Example 2. In this case, the pointing device 3 can be obtained by designing the pointing device 2 of Comparative Example 2 to remove the reflective surface 22 and appropriately designing the shape and the position of the diffraction element 23 and the positions of the reflective lens 20 and the imaging element 13.

(3-2) Specific Examples

The following shows an example of specific numerals of the pointing device 3 having the above configuration.

Reflectance of visible light absorbing polycarbonate resin which is a material of the cover section 16: 1.59

Narrow inclination angle θ formed by inclined surface 19 and touching surface 17: 25°

Thickness z2 of cover section 16 ranging from reflective surface 21 to reflective surface 22: 0.54 mm Length y2 on y-axis ranging from the center of touching surface 17 to the center of troidal surface of reflective lens 20: 2.75 mm Length z1 on z-axis ranging from the center of touching surface 17 to the center of troidal surface of reflective lens 20: 0.43 mm Length y1 on y-axis ranging from the center of touching surface 17 to the center of imaging element 13: 2.1 mm Length z3 on z-axis ranging from the center of touching surface 17 to the center of the imaging element 13: 0.60 mm The reflective lens 20 has a troidal surface in which a x-y cross section is spherical (curvature radius: −0.4193264 mm) and a y-z cross section is aspherical. The aspherical shape is represented by Equation 2 below which is an aspherical equation.

$$Z = \frac{RY^2}{1+\sqrt{1-(1+K)R^2Y^2}} + AY^2 + BY^4 + CY^6 + DY^8 + EY^{10} + FY^{12} + GY^{14} \quad \text{Equation (2)}$$

In the equation, K represents a conic constant, R represents curvature radius, and A, B, C, D, E, F, and G represent second, fourth, sixth, eighth, tenth, twelfth, and fourteenth aspherical coefficients, respectively. Further, Z represents a length of a normal from a point which is on an aspherical surface and is away from an optical axis by a distance Y to a tangent plane at an apex of the aspherical surface (plane perpendicular to the optical axis). Values of the constants are as follows.

K=0
R=−1.2404177
A=−3.6788233
B=40.005615
C=−227.22235
D=−452.94592
E=13006.864
F=−39732.885
G=−35775.58

Comparative Example 4

Figure 4:
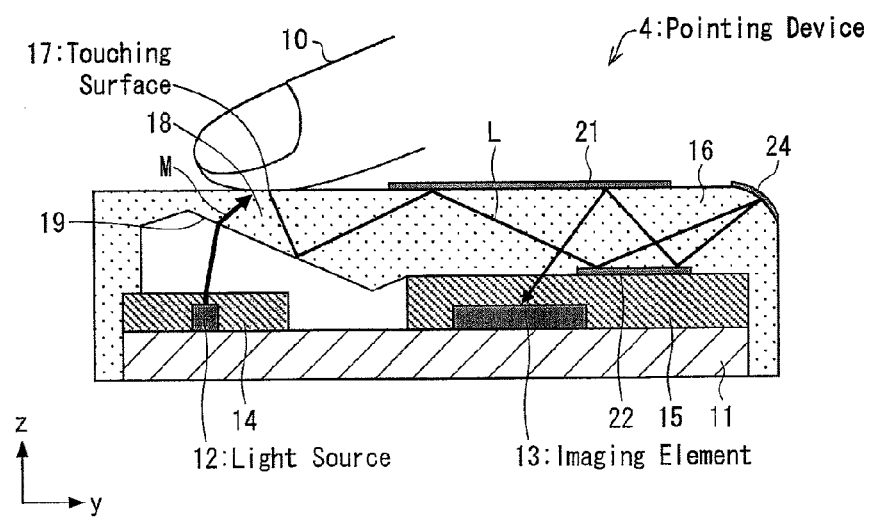
FIG. 4 is a cross sectional drawing showing a configuration of a thin pointing device in accordance with Fourth Comparative Example.

FIG. 4 is a cross sectional drawing showing a configuration of a thin pointing device 4 in accordance with Forth Comparative Example.

As shown in FIG. 4, the pointing device 4 is obtained by arranging the pointing device 1 of Comparative Example 1 to remove the reflective lens 20 in the cover section 16 and instead include a reflective lens 24. That is, the pointing device 4 is different from the pointing device 1 of Comparative Example 1 in terms of positions of reflective lenses.

The cover section 16 includes a touching surface 17, a prism 18, a reflective surface 21, a reflective surface 22, and the reflective lens 24. Unlike Comparative Example 1, a whole upper surface of the resin mold section 15 is attached to a back surface of the cover section 16.

The reflective lens 24 is for reflecting light reflected from the fingertip 10 and focuses an image of the fingertip 10 on the imaging element 13. The reflective lens 24 is positioned diagonally above the imaging element 13 and at a corner formed by an upper face and a side face of the external face of the cover section 16. The reflective lens 24 includes a troidal surface. On the troidal surface of the reflective lens 24 is deposited a reflective film made of a metal (e.g. aluminum, nickel, gold, and silver) and a dielectric dichroic film.

The reflective surface 22 reflects the light reflected from the fingertip 10 and reflected by the reflective surface 21 so that the light travels toward the reflective lens 24, and reflects light reflected from the reflective lens 24 so that the light travels toward the reflective surface 21. The reflective surface 22 is positioned diagonally above the imaging element 13.

The following explains a path in which light emitted from the light source 12 is reflected by the fingertip 10 and is incident to the imaging element 13. The light reflected by the surface of the fingertip 10 is wholly reflected by the inclined surface 19 of the prism 18, and the traveling direction of the light changes to a positive direction of the y-axis. Light L wholly reflected by the inclined surface 19 is reflected by the reflective surfaces 21 and 22 and reaches at the reflective lens 24. The light L is reflected by the reflective lens 24 and then is reflected by the reflective surface 22 and the reflective surface 21, and is incident to the imaging element 13.

The pointing device 1 shown in FIG. 1 is designed such that the reflective lens 20 is provided inside the cover section 16, whereas the pointing device 4 is designed such that the reflective lens 24 is provided at the external surface of the cover section 16. Since the reflective lens 24 is provided at the external surface of the cover section 16, it is unnecessary to design the cover section 16 to have a large concave, making it easier to mold the cover section 16. Further, since it is unnecessary to form a concave inside the cover section 16 which is above the imaging element 13, it is possible to make the thickness of the cover section 16 even. This allows designing the pointing device 4 to be thin while increasing the strength of the cover section 16.

The explanation as above was made as to a case where the pointing device 4 is a modification example of the pointing device 1 of Comparative Example 1. However, the pointing device 4 may be a modification example of the pointing device 2 of Comparative Example 2. Namely, designing the pointing device 2 to replace the reflective lens 20 with the reflective lens 24 and to change an area where the reflective surface 22 is provided so that the size and the position of individual components and elements are appropriate designed allows yielding an effect similar to that of the pointing device 4.

As described above, explanations were made as to thin pointing devices in Comparative Examples 1-4. Similar with cases of the conventional pointing devices, the pointing devices in Comparative Examples 1-4 also suffer from the problem that when an output of the light source 12 is deviated, distribution of light intensity on the touching surface 17 is deviated, making it difficult for the pointing device to correctly detect the movement of the fingertip 10, resulting in malfunction.

The following explains Examples of the present invention which can solve the above problem. A noticeable feature of the present invention is a configuration for emitting even light to the touching surface 17. Configurations of the Examples that are not explained here are the same as those of Comparative Examples 1-4. It should be noted that the descriptions in the Examples are made merely as instances, and detailed configurations and detailed operations of the pointing devices in the Examples may be varied within the scope and the spirit of the present invention.

Explanations of the individual Examples will be made based on the configuration of the pointing device 1 of Comparative Example 1. However, the Examples may be based on the pointing devices 2-4 of Comparative Examples 2-4, and these cases also yield the same effect. In the Examples, for convenience of explanation, members having the same functions as those shown in the drawings of Comparative Examples 1-4 are given the same reference numerals and explanations thereof are omitted here.

Embodiment 1

An embodiment of the present invention will be explained with reference to drawings.

Figure 8:
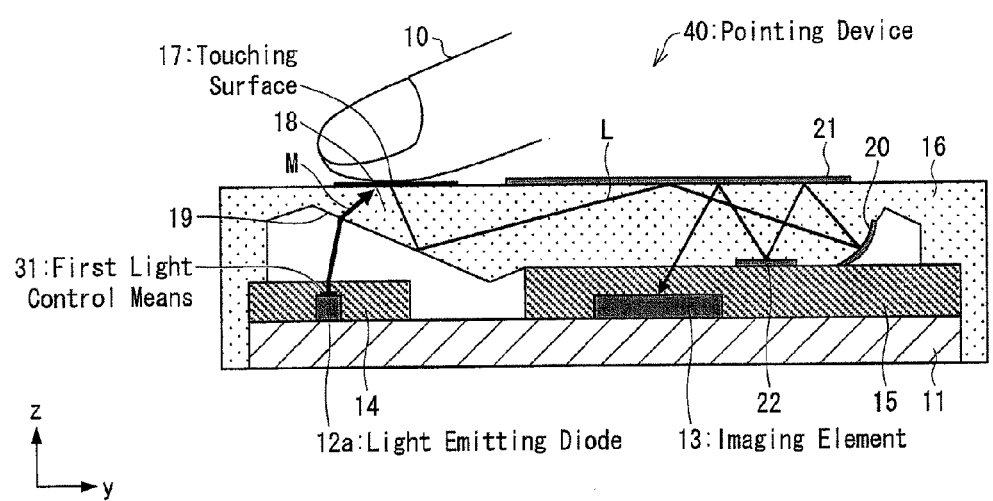
FIG. 8 is a cross sectional drawing showing a configuration of a pointing device in accordance with First Embodiment of the present invention.

FIG. 8 is a cross sectional drawing illustrating an example of a configuration of the pointing device 40 in accordance with the present embodiment.

As illustrated in FIG. 8, the pointing device 40 in accordance with the present embodiment includes first light control means 31 in addition to the configuration of the pointing device 1 shown in FIG. 1. In the pointing device 40 of the present embodiment, the light source 12 is a light emitting diode 12a.

The first light control means 31 is an electrode made of a metal film provided on a top surface of the light emitting diode 12a in such a manner as to be on and around the center of the top surface. Unlike a general metal electrode, the first light control means 31 occupies 78% of the area of the upper surface of the light emitting diode 12a in order to yield a light control effect. Therefore, the first light control means 31 blocks a part of a light path from the light emitting diode 12a to the touching surface 17. Consequently, light emitted from the light emitting diode 12a and reaches at the first light control means 31 is blocked due to metal reflection, but light is emitted from an area other than the first light control means 31. This allows preventing reduction in output of the light emitting diode 12a. The first light control means 31 and the light emitting diode 12a are sealed by a resin mold section 14 (first resin section).

The first light control means 31 may be made of a material that absorbs a wavelength of light emitted from the light emitting diode 12a. However, in this case, the light reaching at the first light control means 31 is wasteful. Therefore, in the pointing device 40, it is desirable that the first light control means 31 is made of a metal film and light is reflected by the metal film.

Further, by positioning the first light control means 31 at a position that allows light to have high intensity, it is possible to prevent unevenness of light intensity. Further, by reusing light reflected from the first light control means 31, it is possible to prevent loss of light. Therefore, this configuration allows the pointing device 40 to consume lower power.

With reference to FIGS. 9 to 12(b), the following details emission of light from the light emitting diode 12a to the touching surface 17 with a provision of the first light control means 31 in the pointing device 40 having the above configuration.

Figure 9:
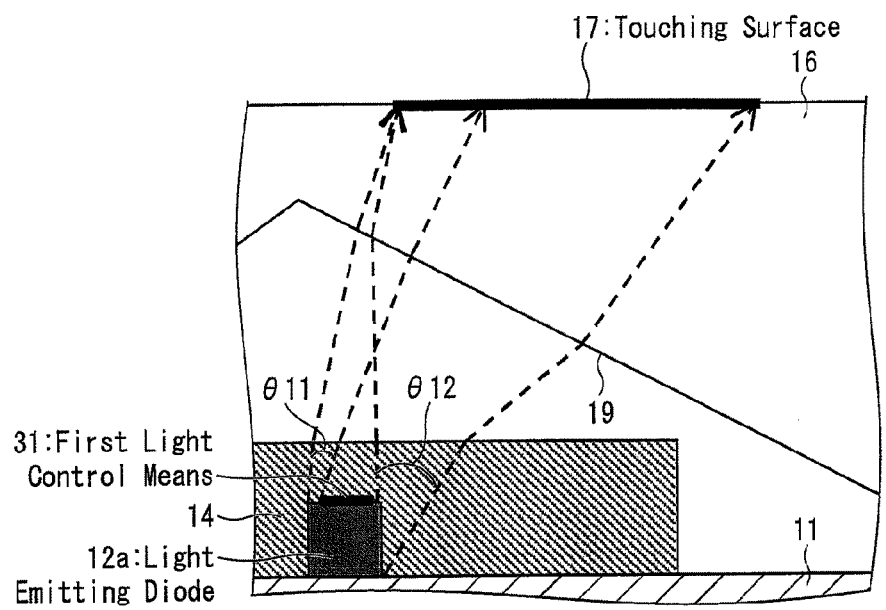
FIG. 9 is a cross sectional drawing showing an illuminating optical system including a light emitting diode and a touching surface in the pointing device in an enlarged manner.
Figure 10:
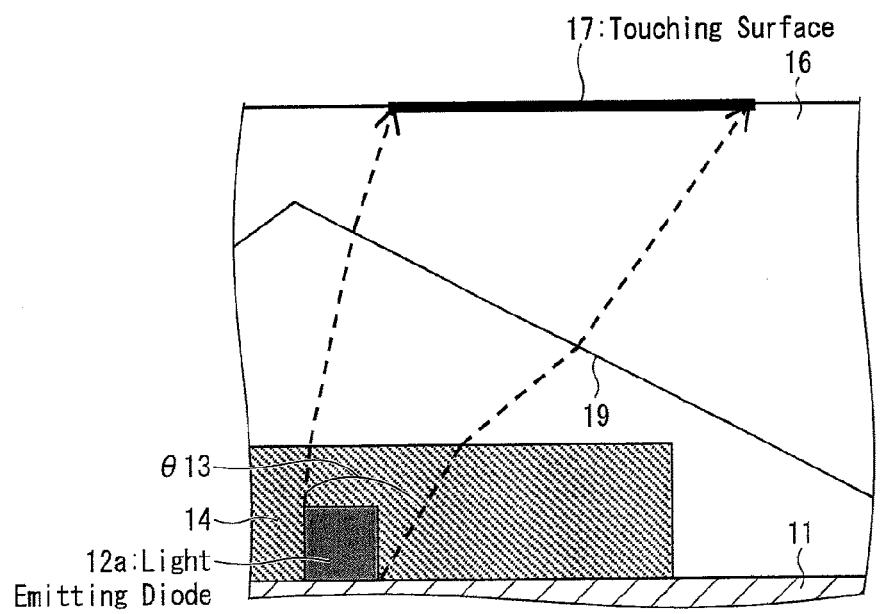
FIG. 10 is a cross sectional drawing showing in an enlarged manner an illuminating optical system including a light emitting diode and a touching surface in the pointing device from which first light control means is excluded.
Figure 11:
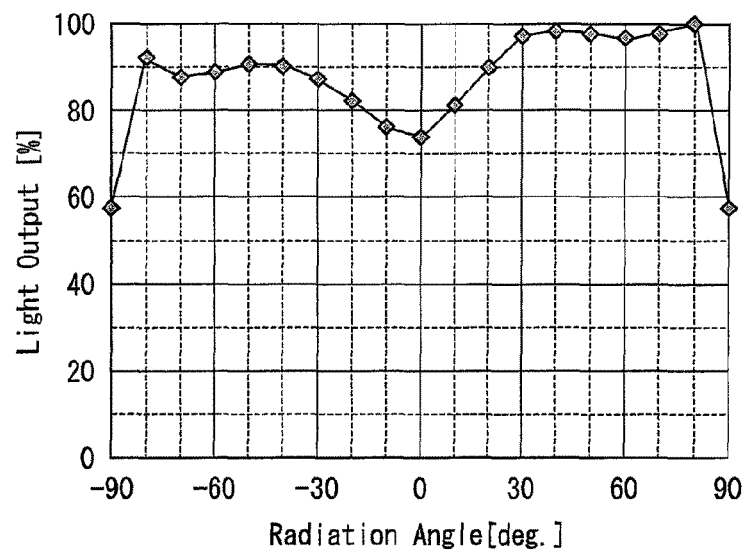
FIG. 11(a) is a graph showing a radiation angle characteristic of a light emitting diode in a case where simulation is made for the configuration of FIG. 9.
FIG. 11(b) is a graph showing a radiation angle characteristic of a light emitting diode in a case where simulation is made for the configuration of FIG. 10.
Figure 11:
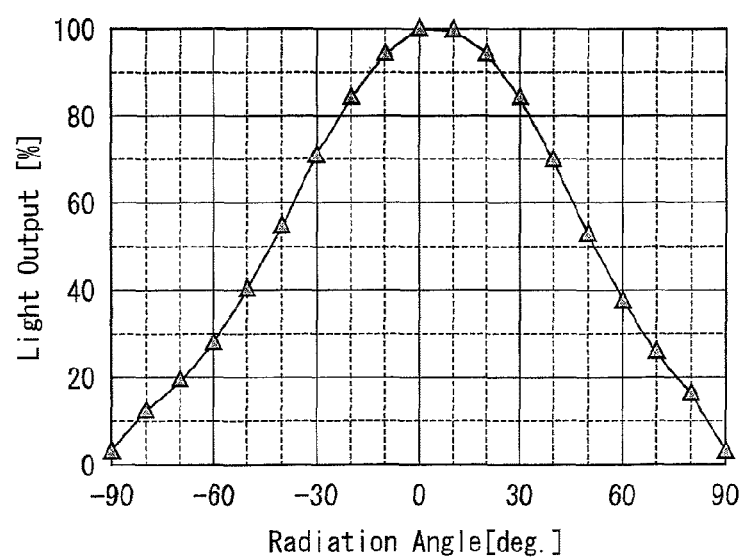
Figure 12:
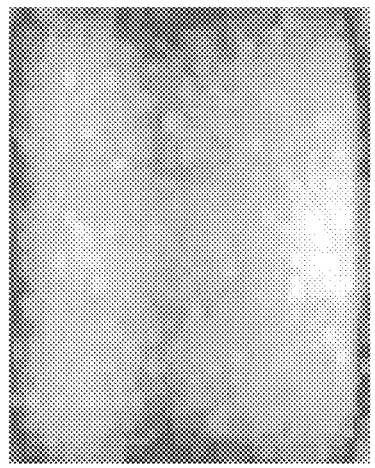
FIG. 12(a) is a drawing showing distribution of light intensity on a touching surface in a case where simulation is made for the configuration of FIG. 9.
FIG. 12(b) is a drawing showing distribution of light intensity on a touching surface in a case where simulation is made for the configuration of FIG. 10.
Figure 12:
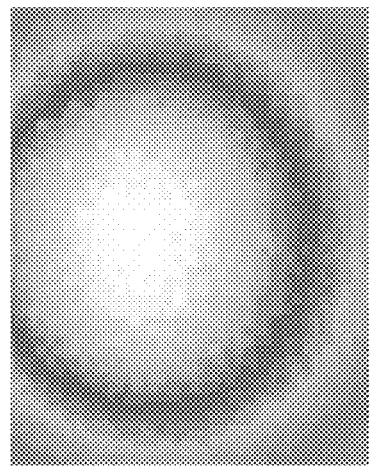

FIG. 9 is an enlarged cross sectional drawing illustrating an illuminating optical system including the light emitting diode 12a and the touching surface 17 in the pointing device 40. FIG. 10 is an enlarged cross sectional drawing illustrating an illuminating optical system including the light emitting diode 12a and the touching surface 17 in the pointing device 40 from which the first optical control means 31 is removed. Namely, the configuration shown in FIG. 10 is equivalent to the configuration of the pointing device 1 shown in FIG. 1. FIG. 11(a) is a graph showing a radiation angle characteristic of the light emitting diode 12a in a case where simulation was made for the configuration shown in FIG. 9. FIG. 11(b) is a graph showing a radiation angle characteristic of the light emitting diode 12a in a case where simulation was made for the configuration shown in FIG. 10. FIG. 12(a) is a graph showing distribution of light intensity on the touching surface 17 in a case where simulation was made for the configuration shown in FIG. 9. FIG. 12(b) is a graph showing distribution of light intensity on the touching surface 17 in a case where simulation was made for the configuration shown in FIG. 10.

Radiation angle characteristics shown in FIGS. 11(a) and 11(b) indicate light intensities at a position 30 mm away from the light emitting diode 12a in a case where a normal axis on the upper surface of the light emitting diode 12a is regarded as 0 degree. Further, in distributions of light intensities shown in FIGS. 12(a) and 12(b), the area of the touching surface 17 is set to 0.8 mm×1.0 mm.

In a case where the first light control means 31 is not provided as shown in FIG. 10, it is possible to secure a large angle component θ13 to be emitted to the touching surface 17 out of radiation angle components of light emitted from the light emitting diode 12a. However, as shown in FIG. 11(b), the light emitting diode 12a has high light intensity at a radiation angle of about 0 degree, and light intensity thereof is deviated with respect to a radiation angle. Consequently, as shown in FIG. 12(b), there is a problem that distribution of light intensity on the touching surface 17 is greatly deviated. Namely, due to the deviation in light intensity, it is difficult for the pointing device to detect the movement of an object.

Figure 29:
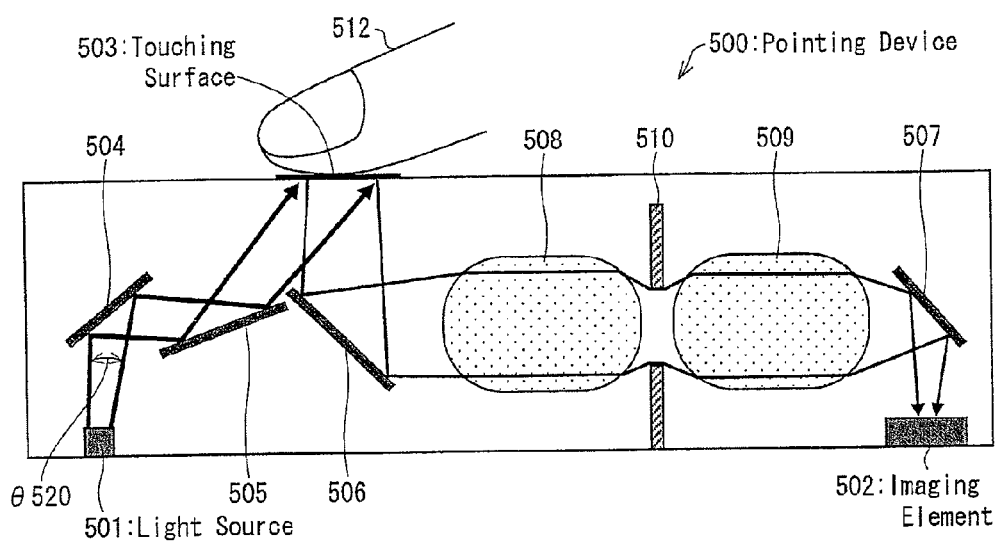
FIG. 29 is a cross sectional drawing showing a configuration of a conventional pointing device.
Figure 30:
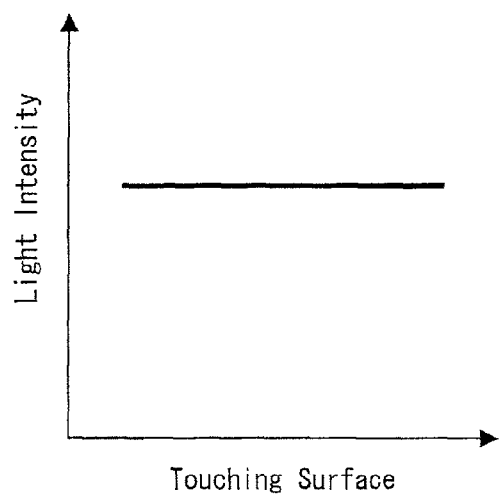
FIG. 30(a) is a drawing illustrating even distribution of light intensity on a touching surface of the conventional pointing device.
FIG. 30(b) is a drawing illustrating deviated distribution of light intensity on a touching surface of the conventional pointing device.
Figure 30:
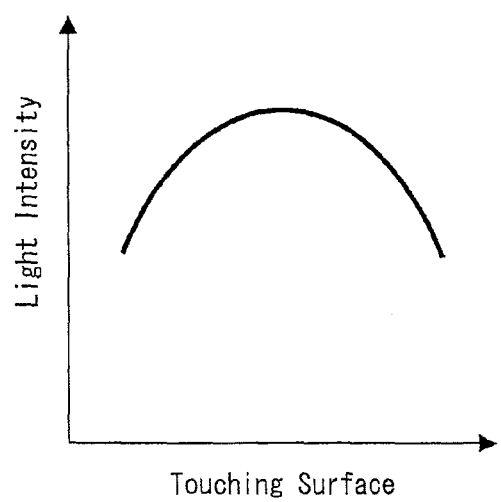
Figure 31:
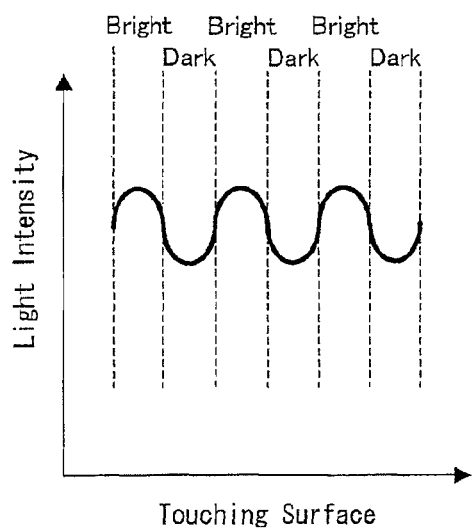
FIG. 31(a) a drawing illustrating light intensity of an even contrast pattern on a touching surface of the conventional pointing device.
FIG. 31(b) is a drawing illustrating light intensity of a deviated contrast pattern on a touching surface of the conventional pointing device.
Figure 31:
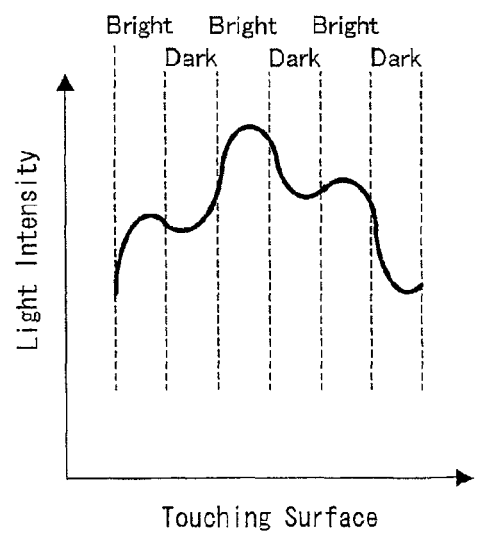
Figure 32:
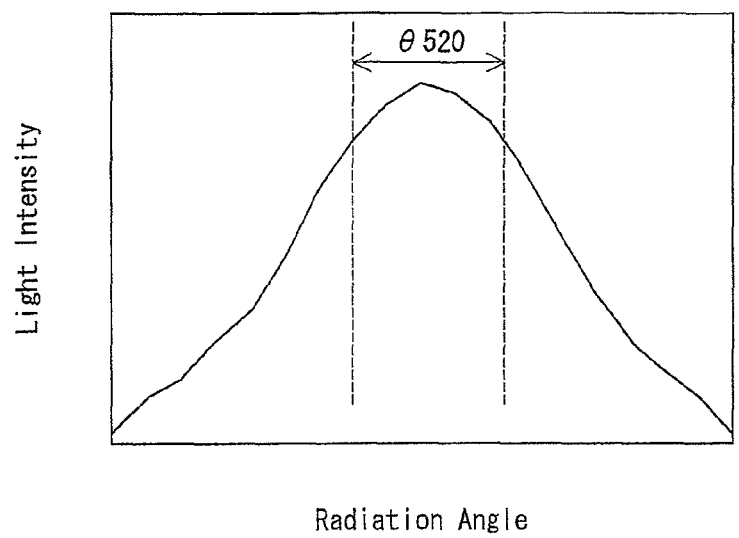
FIG. 32 is a drawing showing a relationship between light intensity and a radiation angle in a conventional light source.

In contrast thereto, in a case where the first light control means 31 is provided as shown in FIG. 9, an angle component to be used is a sum of θ11 and θ12, and is smaller than the angle component θ13 in FIG. 10 and larger than a conventional angle component θ520 in FIGS. 29 and 32. The radiation characteristic of the light emitting diode 12a provided with the first light control means 31, shown in FIG. 11(a), exhibits more even output in a wider range than the radiation characteristic of the light emitting diode 12a not provided with the first light control means 31, shown in FIG. 11(b). Further, as shown in FIG. 12(a), the light emitting diode 12a provided with the first light control means 31 allows subduing deviation in distribution of light intensity on the touching surface 17. Consequently, it is possible for the pointing device to detect the movement of an object.

Accordingly, designing the pointing device 40 to have the first light control means 31 in a light path for illuminating the touching surface 17 allows even distribution of light intensity of light emitted to the touching surface 17 even when an output from the light emitting diode 12a is deviated. This design also allows improving detection accuracy, preventing malfunction.

Further, when the light emitting diode 12a having small deviation in light intensity with respect to a radiation angle is used as a light source, it is possible to yield the effect of the first light control means 31 with a shorter distance. This contributes to making the pointing device 40 thinner.

Further, since the first light control means 31 is directly provided on the light emitting diode 12a, it is possible to make emission profile best suitable for making light intensity on the touching surface 17 even. Further, a configuration of a conventional pointing device can be used only with change of a light emitting element.

Further, it is preferable that the first light control means 31 is provided on the top surface of the light emitting diode 12a in such a manner as to be on and around the center of the top surface. This allows downsizing an area where the first light control means 31 is provided.

In the pointing device 40 explained above, the first light control means 31 is an electrode of the light emitting diode 12a. However, an electrode of the light emitting diode 12a is not always provided on the top surface thereof. The first light control means 31 may be a metal film provided on the light emitting diode 12a. In a case where the electrode of the light emitting diode 12a is used as the first light control means 31, changing a mask for forming an electrode pattern for the light emitting diode 12a allows producing the first light control means 31, and therefore a conventional process may be used.

Embodiment 2

The following explains another embodiment of the present invention with reference to drawings.

Figure 13:
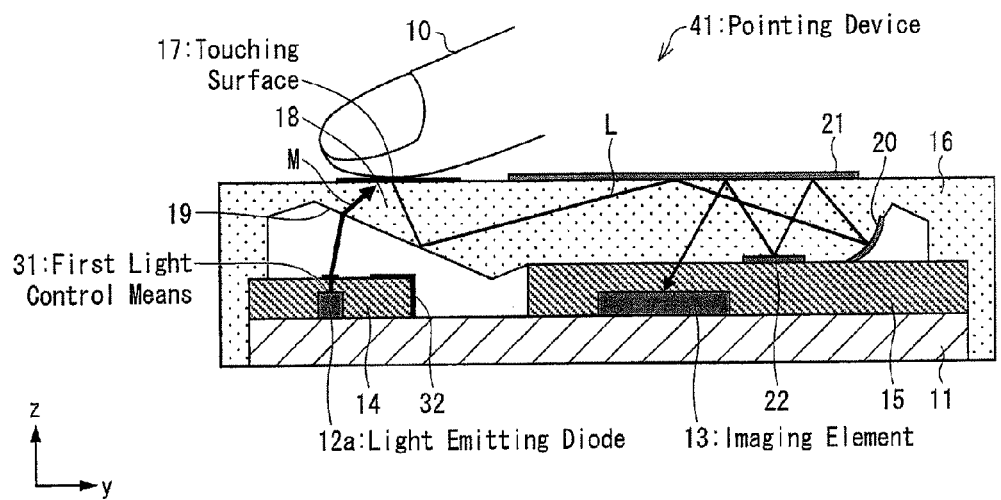
FIG. 13 is a cross sectional drawing showing a configuration of a pointing device in accordance with Second Embodiment of the present invention.
Figure 14:
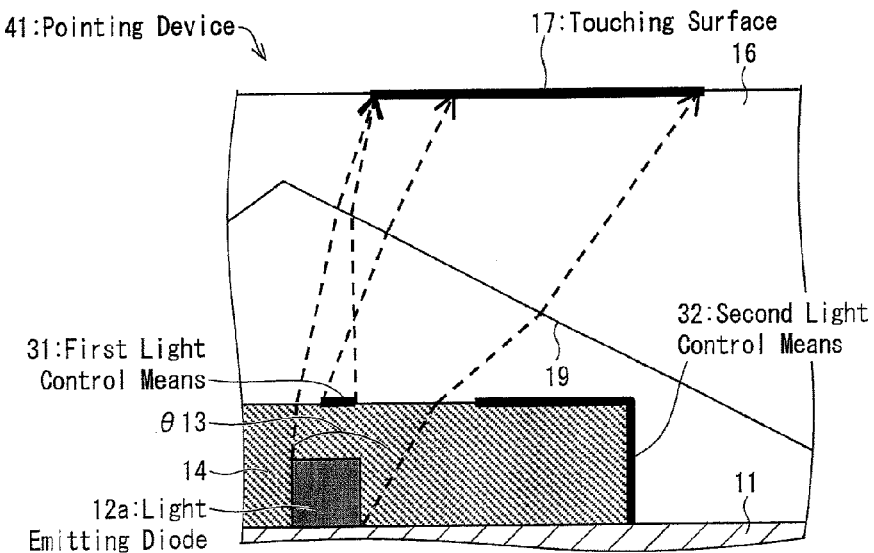
FIG. 14 is a cross sectional drawing showing an illuminating optical system including a light emitting diode and a touching surface in the pointing device in an enlarged manner.

FIG. 13 is a cross sectional drawing showing a configuration example of the pointing device 41 of the present embodiment. FIG. 14 is an enlarged cross sectional drawing showing an illuminating optical system including a light emitting diode 12a and a touching surface 17 in a pointing device 41 in FIG. 13.

As shown in FIGS. 13 and 14, the pointing device 41 of the present embodiment includes second light control means 32 in addition to the configuration of the pointing device 40 of FIG. 8 explained in Embodiment 1.

The second light control means 32 blocks light emitted from the light emitting diode 12a and reaching the imaging element 13. In other words, the second light control means 32 blocks light that does not contribute to illumination of the touching surface 17 out of light emitted from the light emitting diode 12a. The second light control means 32 is provided on a resin mold section 14 in such a manner as to be on a surface closer to the imaging element 13 and on a part of a top surface adjacent to the surface.

The pointing device 41 is designed such that light reaching the first light control means 31 is blocked. Consequently, the blocked light is lost. However, since the first light control means 31 is provided on the resin mold section 14, a large angle component θ13 to be used is secured, making light intensity on the touching surface 17 even. Further, in addition to a configuration in which the resin mold section 14 and a resin mold section 15 are separately molded to prevent stray light from the light emitting diode 12a from directly illuminating the imaging element 13, the second light control means 32 is provided on the resin mold section 14 in such a manner as to be closer to the imaging element 13. This prevents stray light from being incident to the imaging element 13, preventing malfunction of the pointing device 41 due to stray light.

Further, since the second light control means 32 is provided on the resin mold section 14, the second light control means 32 is positioned close to the light emitting diode 12a. This allows downsizing an area where the second light control means 32 is provided, avoiding a growth in size of a device. Therefore, only with a simple configuration that does not cause a growth in size, it is possible to prevent stray light.

Further, since the first light control means 31 is provided on the resin mold section 14, it is possible to yield a light control effect while key devices such as a light emitting element and a component cover are the same as those of a conventional pointing device.

It is preferable to design the pointing device 41 such that the first light control means 31 and the second light control means 32 are made of a light absorbing material. For example, the first light control means 31 and the second light control means 32 may be made of resin or may be made by applying ink as long as the resin or the ink includes an absorbing component with respect to a wavelength of light emitted from the light emitting diode 12a. In a case where the first light control means 31 and the second light control means 32 are made of resin, the first light control means 31 and the second light control means 32 may be made by molding such as potting or printing. Since both of the first light control means 31 and the second light control means 32 are provided on the resin mold section 14, the first light control means 31 and the second light control means 32 can be produced by the same process.

The first light control means 31 and the second light control means 32 to be provided on the resin mold section 14 may be made of a light reflective material. When the light reflective material is a metal film, the first light control means 31 and the second light control means 32 may be made by sputtering or vapor deposition. It is preferable that the metal film is an aluminum (Al) film in terms of adhesiveness and anti-oxidization property, and it is more preferable that an Al film surface is covered with resin in order to prevent oxidization. It should be noted that in a case of covering the Al film surface with resin, it is preferable to cover only the Al film surface and not to cover the top surface of the resin mold section 14 in order to avoid loss of a light path. In a case where the first light control means 31 and the second light control means 32 are made of a light reflective material, careful attention should be paid so that the first light control means 31 and the second light control means 32 do not serve as light sources for stray light.

Embodiment 3

Figure 15:
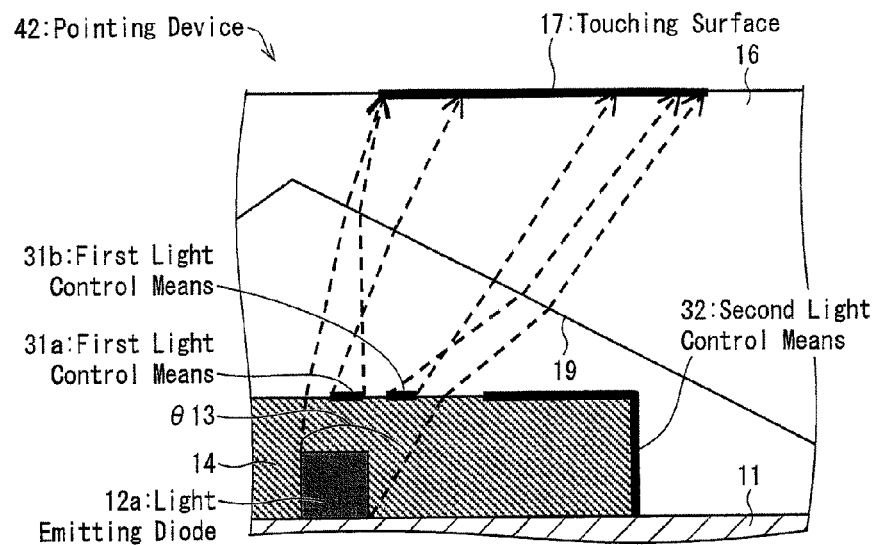
FIG. 15 is a cross sectional drawing showing an illuminating optical system including a light emitting diode and a touching surface in a pointing device in an enlarged manner, in accordance with Third Embodiment of the present invention.

FIG. 15 is a cross sectional drawing showing a configuration example of a pointing device 42 of the present embodiment, and showing an illuminating optical system including the light emitting diode 12a and the touching surface 17 in an enlarged manner.

The pointing device 41 shown in FIG. 13 explained in Embodiment 2 is designed such that the first light control means 31 is provided at only one position. Alternatively, the first light control means 31 may be provided at plural positions if necessary. For example, as shown in FIG. 15, the pointing device 42 of the present embodiment is designed such that the resin mold section 14 is provided with first light control means 31a and 31b.

The first light control means 31a and 31b are provided on the top surface of the resin mold section 14 and at the same time on a light path from the light emitting diode 12a to the touching surface 17. Further, in order to block light with particularly high light intensity, the first light control means 31a is provided on an extension of a central axis on the top surface of the light emitting diode 12a.

In the pointing device 42, light reaching the first light control means 31a and 31b is lost. In return, it is possible to secure a large angle component θ13 to be used. This allows making light intensity on the touching surface 17 even.

Further, it is preferable that the first light control means 31a is provided on the top surface of the resin mold section 14 in such a manner as to be on an area including a normal axis that passes through the center of the top surface of the light emitting diode 12a. This allows downsizing an area where the first light control means 31a is provided.

Embodiment 4

Figure 16:
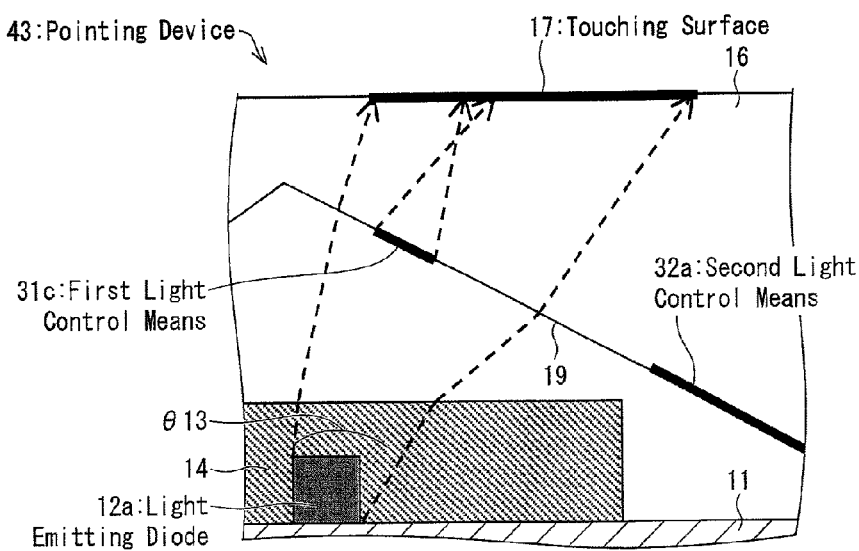
FIG. 16 is a cross sectional drawing showing an illuminating optical system including a light emitting diode and a touching surface in a pointing device in an enlarged manner, in accordance with Fourth Embodiment of the present invention.

FIG. 16 is a cross sectional drawing showing a configuration example of a pointing device 43 of the present embodiment, and showing an illuminating optical system including a light emitting diode 12a and a touching surface 17 in an enlarged manner.

The pointing device 41 shown in FIG. 13 explained in Embodiment 2 is designed such that the first light control means 31 and the second light control means 32 are provided on the resin mold section 14. In contrast to the configuration of the pointing device 41 of FIG. 13, the pointing device 43 of the present embodiment is designed such that first light control means 31 and second light control means 32 are positioned differently. That is, as shown in FIG. 16, the pointing device 43 of the present embodiment is designed such that first light control means 31c and second light control means 32a are provided on an inclined surface 19 of a cover section 16.

The first light control means 31c and the second light control means 32a are provided on the inclined surface 19 of the cover section 16 in such a manner that the first light control means 31c and the second light control means 32a are not on an area which reflects an image of a fingertip 10. The cover section 16 includes optical functions such as reflective surfaces 21 and 22, and the first light control means 31c and the second light control means 32a can be produced simultaneously with production of such optical functions by a process for producing such optical functions.

In the pointing device 43, light reaching the first light control means 31c is lost. In return, it is possible to secure a large angle component θ13 to be used, making light intensity on the touching surface 17 even. Further, provision of the second light control means 32a prevents stray light from the light emitting diode 12a from directly illuminating the imaging element 13.

Further, since the first light control means 31c and the second light control means 32a are provided on the cover section 16, producing the first light control means 31c and the second light control means 32a by a process for producing optical functions in the cover section 16 allows preventing increases in the number of components and in costs which are caused by provision of the first light control means 31c and the second light control means 32a. Therefore, the pointing device 43 is preferably used as a pointing device having a housing which yields an optical effect such as reflecting light and converging light.

Embodiment 5

Figure 17:
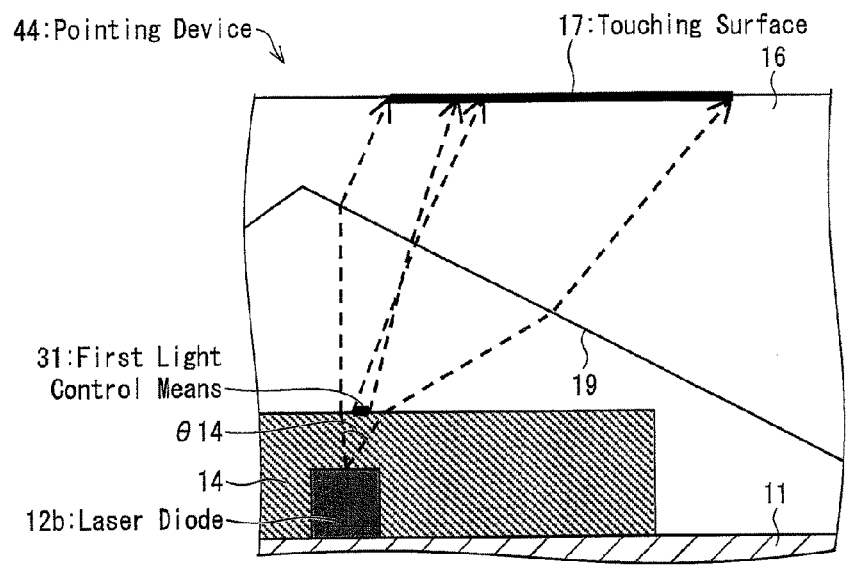
FIG. 17 is a cross sectional drawing showing an illuminating optical system including a light emitting diode and a touching surface in a pointing device in an enlarged manner, in accordance with Fifth Embodiment of the present invention.

FIG. 17 is a cross sectional drawing showing a configuration example of a pointing device 44 of the present embodiment, and showing an illuminating optical system including a laser diode 12b and a touching surface 17 in an enlarged manner.

The pointing device 40 shown in FIG. 8 explained in Embodiment 1 includes the light emitting diode 12a as the light source 12. In contrast thereto, the pointing device 44 of the present embodiment includes a laser diode 12b as the light source 12. Namely, as shown in FIG. 17, the pointing device 44 of the present embodiment is different from the pointing device 40 of FIG. 8 in that the pointing device 44 includes the laser diode 12b instead of the light emitting diode 12a.

The laser diode 12b is of a surface light emitting type, and has higher directivity than the light emitting diode 12a. Accordingly, the pointing device 44 including the laser diode 12b allows preventing stray light to the imaging element 13.

Since the laser diode 12b has high directivity as described above, a radiation angle characteristic of light from the laser diode 12b has higher deviation than that of FIG. 11(b). Accordingly, although use of the laser diode 12b prevents stray light, equalization of light intensity on the touching surface 17 is requested. However, since the laser diode 12b generally has a light emitting section with a size of 10 µm or so, it is difficult to provide the light emitting section with the first light control means 31.

Accordingly, the pointing device 44 is designed such that the first light control means 31 is provided on the top surface of the resin mold section 14. Concurrently, this first light control means 31 is provided on a light path running from the laser diode 12b to the touching surface 17. Further, the first light control means 31 is made of resin which absorbs light. Consequently, although light reaching the first light control means 31 is lost, it is possible to make light intensity on the touching surface 17 even.

Embodiment 6

Figure 18:
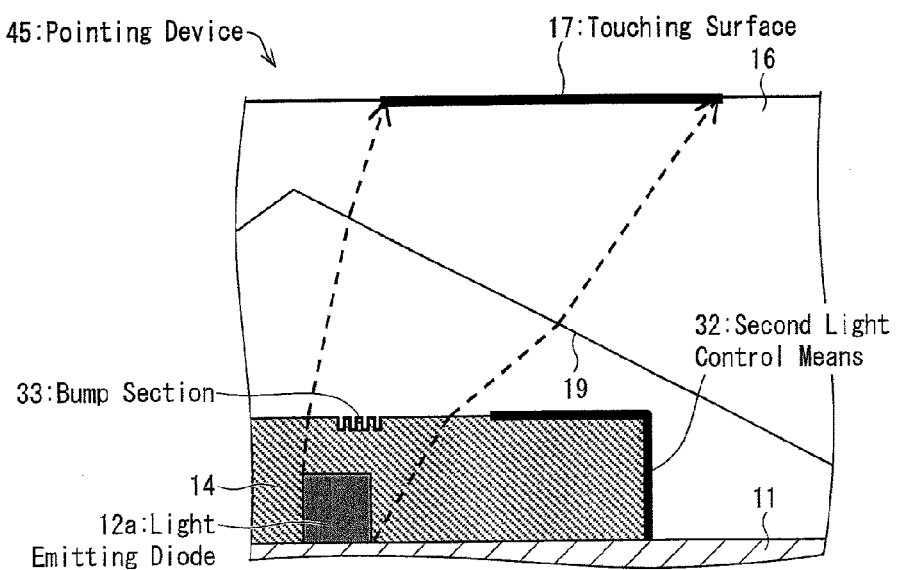
FIG. 18 is a cross sectional drawing showing an illuminating optical system including a light emitting diode and a touching surface in a pointing device in an enlarged manner, in accordance with Sixth Embodiment of the present invention.

FIG. 18 is a cross sectional drawing showing a configuration example of a pointing device 45 of the present embodiment, and showing an illuminating optical system including a light emitting diode 12a and a touching surface 17 in an enlarged manner.

As shown in FIG. 18, the pointing device 45 of the present embodiment is the same as the pointing device 41 of FIG. 13 explained in Embodiment 2 except that the pointing device 45 includes a bump section 33 (first light control means) on a resin mold section 14, instead of the first light control means 31.

The bump section 33 has a bump structure in which concavities and convexities are repeated periodically, and scatters light reaching the bump section 33. The bump section 33 is provided on a part of the top surface of the resin mold section 14 in such a manner as to be on a light path from the light emitting diode 12a to the touching surface 17. Since an interface between the bump section 33 of the resin mold section 14 and an internal space of the pointing device 45 has concavities and convexities, it is possible to scatter light exiting from the surface of the bump section 33.

An example of a method for forming the bump section 33 in the resin mold section 14 is forming a bump pattern in a mold for the resin mold section 14 in advance and transferring the pattern to the resin mold section 14 when the resin mold section 14 is produced. This method is preferable since this method allows easy formation of the bump section 33.

The pointing device 45 is designed such that the bump section 33 is provided on a part of the top surface of the resin mold section 14. Accordingly, the bump section 33 selectively scatters light and thus efficiently equates light intensity on the touching surface 17. Since the pointing device 45 does not have a part where light is lost, such as a light absorbing material and a light reflective material, the pointing device 45 allows reducing power consumption. Further, since the bump section 33 is provided on a part of the top surface of the resin mold section 14 for the purpose of selectively scattering a part of light with higher intensity, an area where the bump section 33 is provided can be small.

It is preferable to design the bump section 33 such that a difference between a concavity and convexity, a width of a convexity, and a width of a concavity are set to 10 µm or less. When the concavities and convexities of the bump section 33 have a minute structure of 10 µm or less, the difference between a concavity and convexity, the width of a convexity, and the width of a concavity are close to the wavelength of light used in the pointing device 45. Further, in the case of the bump structure of 10 µm or less, it is possible to obtain the effect of Mie scattering. Further, in a case where a difference between a convexity and a concavity is smaller than the wavelength, the obtained effect is mainly Rayleigh scattering. Therefore, the difference between a concavity and convexity, the width of a convexity, and the width of a concavity in the bump section 33 may be equal to or smaller than the wavelength of light emitted from the light emitting diode 12a. The minute bump structure may be produced by molding as above. Nanoimprinting is particularly preferable since the nanoimprinting allows relatively easy production of a bump structure in submicron order.

Embodiment 7

Figure 19:
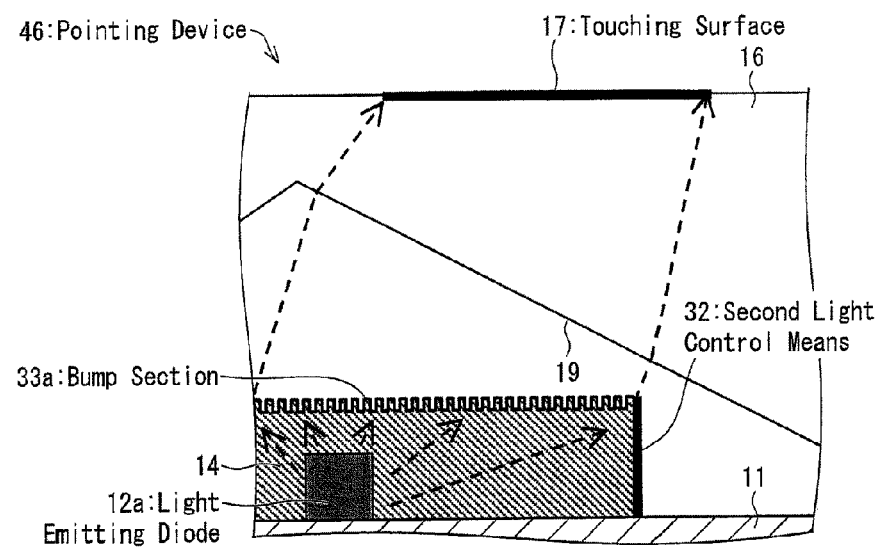
FIG. 19 is a cross sectional drawing showing an illuminating optical system including a light emitting diode and a touching surface in a pointing device in an enlarged manner, in accordance with Seventh Embodiment of the present invention.

FIG. 19 is a cross sectional drawing showing a configuration example of a pointing device 46 of the present embodiment, and showing an illuminating optical system including a light emitting diode 12a and a touching surface 17 in an enlarged manner.

The pointing device 45 shown in FIG. 18 explained in Embodiment 6 is designed such that the bump section 33 is provided on a part of the top surface of the resin mold section 14. In contrast to the configuration of the pointing device 45 shown in FIG. 18, the pointing device 46 of the present embodiment is designed such that the bump section 33 is provided differently. Namely, as shown in FIG. 19, the pointing device 46 of the present embodiment is designed such that a bump section 33a (first light control means) is provided on a whole top surface of the resin mold section 14. It should be noted that in the pointing device 46, the second light control means 32 is not provided on the top surface of the resin mold section 14.

The bump section 33a has a bump structure in which concavities and convexities are repeated periodically, and scatters light reaching the bump section 33a. The bump section 33a is provided on the whole top surface of the resin mold section 14. Since an interface between the resin mold section 14 and an internal space of the pointing device 45 has concavities and convexities, it is possible to scatter light exiting from the resin mold section 14. Further, the concavities and convexities of the bump section 33a may be changed suitably, yielding a scattering effect according to necessity.

An effective method for producing the bump section 33a in the resin mold section 14 is transferring a pattern formed in the aforementioned mold. Alternatively, the same structure can be easily obtained by using a mold subjected to satin finish. A difference between a concavity and a convexity, a width of a concavity, and a width of a convexity in a satin-like pattern are approximately 1 to 15 μm. Use of the mold subjected to the satin finish allows easily producing the bump section 33a yielding a high scattering effect.

In the pointing device 46, the bump section 33a is provided on the whole top surface of the resin mold section 14 and thus scatters light wholly at the above area. This allows equating light intensity on the touching surface 17. This allows the pointing device 46 to realize low power consumption.

Embodiment 8

Figure 20:
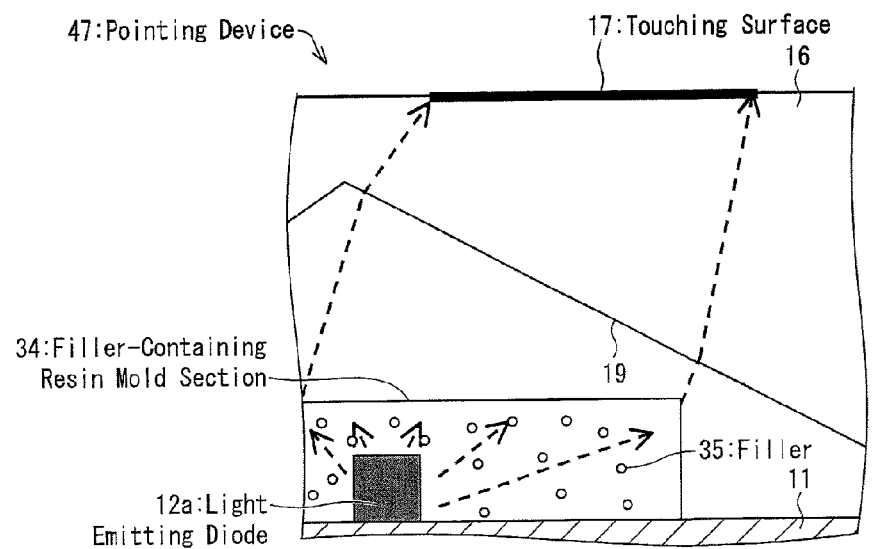
FIG. 20 is a cross sectional drawing showing an illuminating optical system including a light emitting diode and a touching surface in a pointing device in an enlarged manner, in accordance with Eighth Embodiment of the present invention.

FIG. 20 is a cross sectional drawing showing a configuration example of a pointing device 47 of the present embodiment, and showing an illuminating optical system including the light emitting diode 12a and the touching surface 17 in an enlarged manner.

As shown in FIG. 20, the pointing device 47 of the present embodiment is different from the pointing device 40 shown in FIG. 8 explained in Embodiment 1 in that the pointing device 47 includes a filler-containing resin mold section 34 (first light control means) in which filler 35 is mixed (added), instead of the resin mold section 14 and the first light control means 31. In FIG. 20, the filler 35 is described in a schematic and enlarged manner.

In the pointing device 47, light emitted from the light emitting diode 12a is scattered by the filler 35 in the filler-containing resin mold section 34, thereby causing multiple scattering. This scattering effect equates light passing through the filler-containing resin mold section 34, subduing deviation of light intensity on the touching surface 17.

The filler 35 to be used is preferably a particulate filling material whose diameter is 10 μm or less. The diameter of 10 μm or less is close to a wavelength of light used in the pointing device 47. In a case where the filler 35 has a diameter close to the wavelength of the light, it is possible to obtain the effect of Mie scattering. Further, in a case where the filler 35 has a diameter smaller than the wavelength, the obtained effect is mainly Rayleigh scattering. Accordingly, the diameter of the filler 35 may be equal to or less than the wavelength of the light emitted from the light emitting diode 12a.

Embodiment 9

Figure 21:
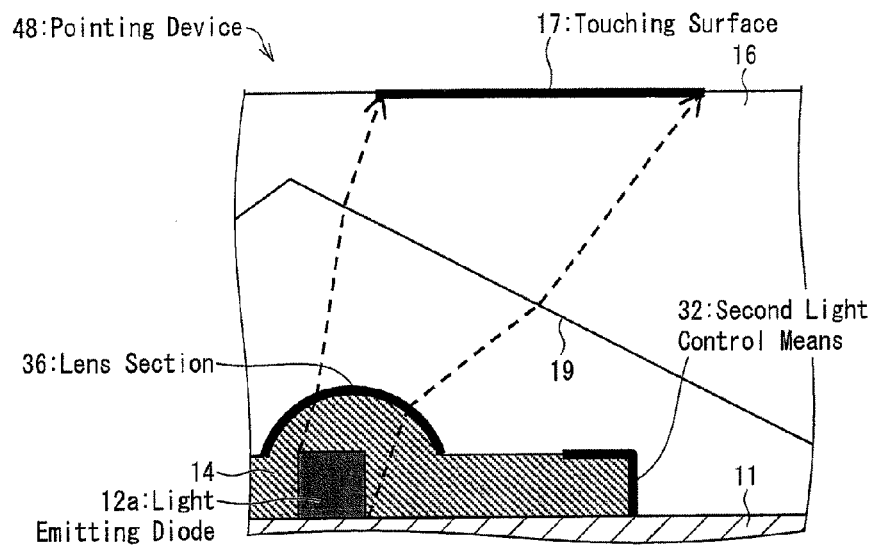
FIG. 21 is a cross sectional drawing showing an illuminating optical system including a light emitting diode and a touching surface in a pointing device in an enlarged manner, in accordance with Ninth Embodiment of the present invention.

FIG. 21 is a cross sectional drawing showing a configuration example of a pointing device 48 of the present embodiment, and showing an illuminating optical system including the light emitting diode 12a and the touching surface 17 in an enlarged manner.

As shown in FIG. 21, the pointing device 48 of the present embodiment is different from the pointing device 41 shown in FIG. 13 explained in Embodiment 2 in that the pointing device 48 includes a lens section 36 (first light control means) formed in the resin mold section 14, instead of the first light control means 31.

The lens section 36 is a lens structure having a concavely curved portion, and diffuses light that reaches the lens section 36. The lens section 36 is provided at a part of the top surface of the resin mold section 14. Namely, a curved portion formed at a part of the top surface of the resin mold section 14 constitutes the lens section 36. By setting a distance between the top surface of the resin mold section 14 and the light emitting diode 12a to be smaller than curvature radius of the lens section 36, it is possible to yield an effect of scattering light.

A method for forming the lens section 36 in the resin mold section 14, i.e. a method for forming a curved portion with a lens effect in the resin mold section 14 is forming the lens section 36 together with the resin mold section 14 using a mold to which a pattern to be transferred is given. This method allows easily forming the lens section 36.

In the pointing device 48, the lens section 36 is provided at a part of the top surface of the resin mold section 14, and thus diffuses light so that light intensity on the touching surface 17 is efficiently equated. Further, curvature radius of the lens section 36 can be varied appropriately. For example, by designing a lens structure such that a portion requiring a higher diffusing effect has a small curvature radius and a portion not so requiring a diffusing effect has a large curvature radius, the diffusing effect according to necessity can be obtained. Further, a portion with particularly small light intensity may be set to have a further large curvature radius so as to yield a light converging effect, thereby equating distribution of light intensity on the touching surface 17.

Embodiment 10

Figure 22:
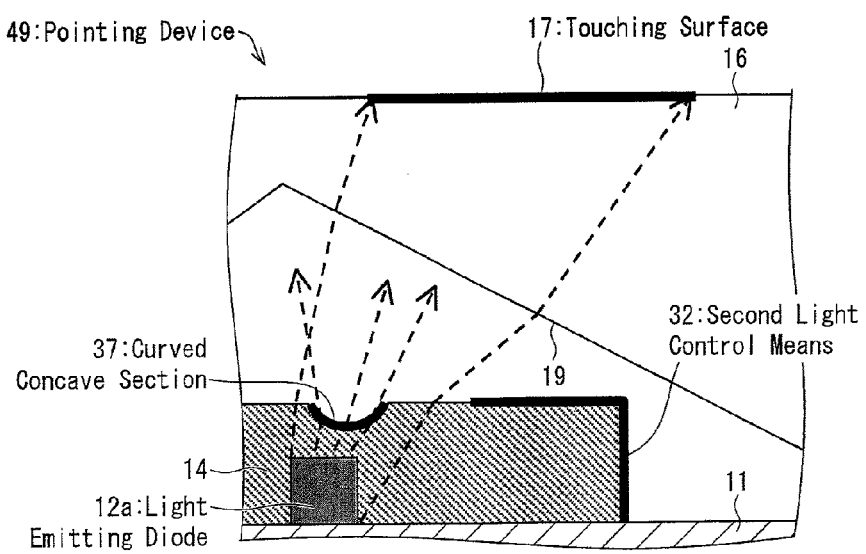
FIG. 22 is a cross sectional drawing showing an illuminating optical system including a light emitting diode and a touching surface in a pointing device in an enlarged manner, in accordance with Tenth Embodiment of the present invention.

FIG. 22 is a cross sectional drawing showing a configuration example of a pointing device 49 of the present embodiment, and showing an illuminating optical system including the light emitting diode 12a and the touching surface 17 in an enlarged manner.

As shown in FIG. 22, the pointing device 49 of the present embodiment is different from the pointing device 41 shown in FIG. 13 explained in Embodiment 2 in that the pointing device 49 includes a curved concave section 37 (first light control means) formed in a resin mold section 14, instead of the first light control means 31.

The curved concave section 37 has a curved concave structure, and diffuses light reaching the curved concave section 37. The curved concave section 37 is provided on a part of the top surface of the resin mold section 14. Since an interface between the curved concave section 37 of the resin mold section 14 and an internal space of the pointing device 45 has a curved concave shape, it is possible to diffuse light exiting from the surface of the curved concave section 37. An example of a method for forming the curved concave section 37 in the resin mold section 14 is a method for forming the curved concave section 37 together with the resin mold section 14 by using a mold to which a pattern to be transferred is given.

In the pointing device 49, the curved concave section 37 is provided at a part of the top surface of the resin mold section 14. This allows light to be diffused, thereby efficiently equating light intensity on the touching surface 17.

Embodiment 11

Figure 23:
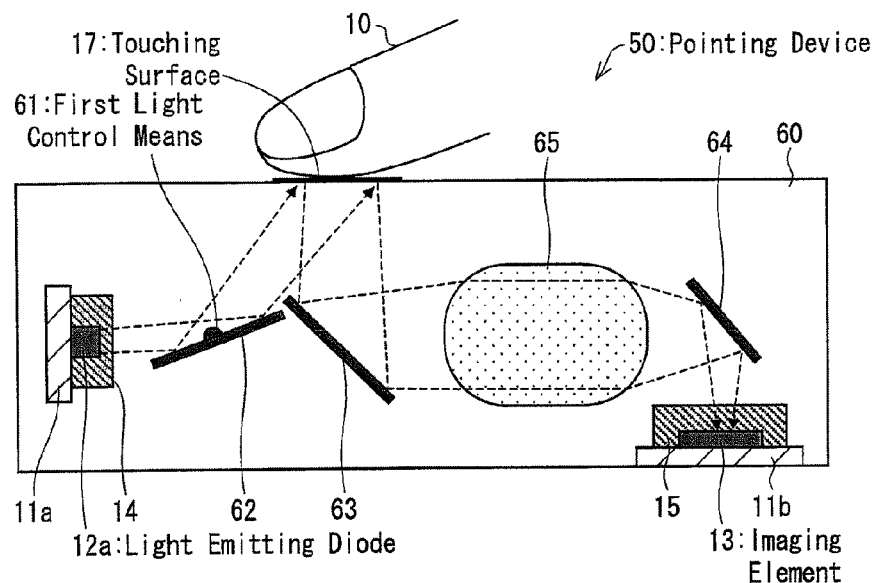
FIG. 23 is a cross sectional drawing showing a configuration of a pointing device in accordance with Eleventh Embodiment of the present invention.

FIG. 23 is a cross sectional drawing showing a configuration example of a pointing device 50 of the present embodiment.

As shown in FIG. 23, the pointing device 50 of the present embodiment includes a circuit substrates 11a and 11b, a light emitting diode 12a, an imaging element 13, a resin mold section 14, a resin mold section 15, a housing 60, first light control means 61, a reflective mirror 62 (optical component), reflective mirrors 63 and 64, and a wave guide tube 65.

The light emitting diode 12a is sealed by the resin mold section 14 and mounted on the circuit substrate 11a. The light emitting diode 12a is positioned in the housing 60 in such a manner that an optical axis of the light emitting diode 12a is in a lateral direction in the drawing. The imaging element 13 is sealed by the resin mold section 15 and mounted on the circuit substrate 11b. The imaging element 13 is positioned in the housing 60 in such a manner that an imaging surface faces upward in the drawing.

The housing 60 has the touching surface 17. The reflective mirrors 62 to 64 and the wave guide tube 65 constitute an optical system of the pointing device 50. That is, the light emitting diode 12a, the imaging element 13, the touching surface 17, the reflective mirrors 62 to 64, and the wave guide tube 65 constitute the optical system of the pointing device 50.

The first light control means 61 has a curved convex structure, and diffuses light. The first light control means 61 is provided on the reflective surface of the reflective mirror 62. Light incident to the convex structure is reflected in a diffused manner. Therefore, it is preferable that the first light control means 61 is provided at a position where light intensity is particularly high. An example of a method for forming the first light control means 61 is a method for forming the first light control means 61 together with the reflective mirror 62 by using a mold to which a pattern to transfer a required curvature is given.

In the pointing device 50 having the above configuration, light emitted from the light emitting diode 12a is reflected by the reflective mirror 62 so that the light is incident to the touching surface 17. A fingertip 10 which is an object touches the touching surface 17 while operating the pointing device 50. When the fingertip 10 touches the touching surface 17, light emitted to the touching surface 17 is scattered and reflected on the surface of the fingertip 10. The light reflected on the surface of the fingertip 10, i.e. the light indicative of an image of the fingertip 10 is reflected by the reflective mirror 63, passes through the wave guide tube 65, reflected by the reflective mirror 64, and reaches the imaging element 13. The imaging element 13 detects the movement of the fingertip 10 based on the light.

In the pointing device 50, the first light control means 61 is provided on the reflective surface of the reflective mirror 62 in such a manner as to be on a light path from the light emitting diode 12a to the touching surface 17. This allows diffusing light, thereby efficiently equating light intensity on the touching surface 17.

Embodiment 12

Figure 24:
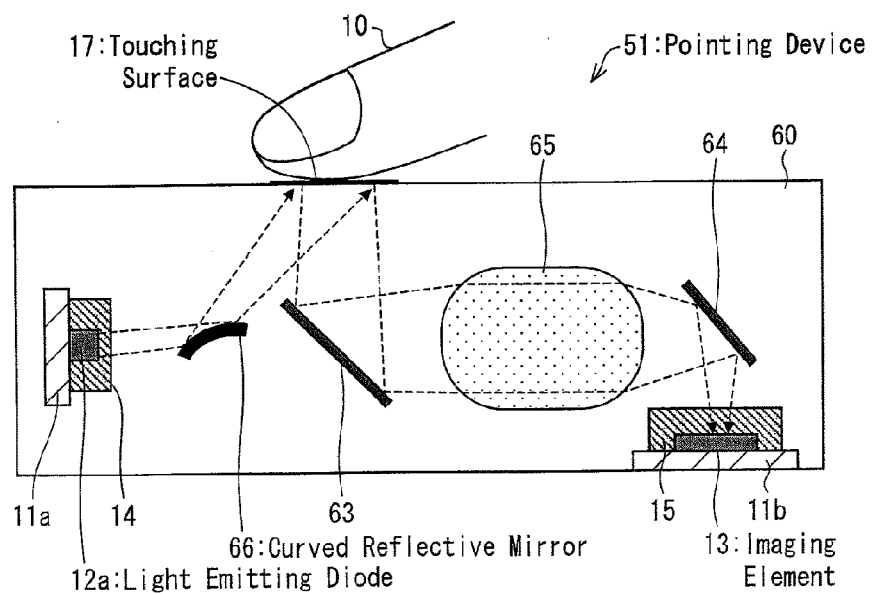
FIG. 24 is a cross sectional drawing showing a configuration of a pointing device in accordance with Twelfth Embodiment of the present invention.

FIG. 24 is a cross sectional drawing showing a configuration example of a pointing device 51 of the present embodiment.

As shown in FIG. 24, the pointing device 51 of the present embodiment is different from the pointing device 50 shown in FIG. 23 explained in Embodiment 11 in that the pointing device 51 includes a curved reflective mirror 66 (first light control means) instead of the first light control means 61 and the reflective mirror 62.

The curved reflective mirror 66 is a curved reflective mirror, and reflects light in a diffused manner. Since the curved reflective mirror 66 includes a curved shape, the curved reflective mirror 66 can diffuse light. A curvature radius of the curved reflective mirror 66 can be varied appropriately. By designing the curved reflective mirror 66 to have a structure in which a portion requiring a higher diffusing effect has a small curvature radius and a portion not so requiring a diffusing effect has a large curvature radius, the curved reflective mirror 66 can yield a required diffusing effect. An example of a method for forming the curved reflective mirror 66 is a method for forming the curved reflective mirror 66 by using a mold to which a pattern to transfer a required curvature is given.

In the pointing device 51, light is diffused by the curved reflective mirror 66. This allows efficiently equating light intensity on the touching surface 17.

Embodiment 13

Figure 25:
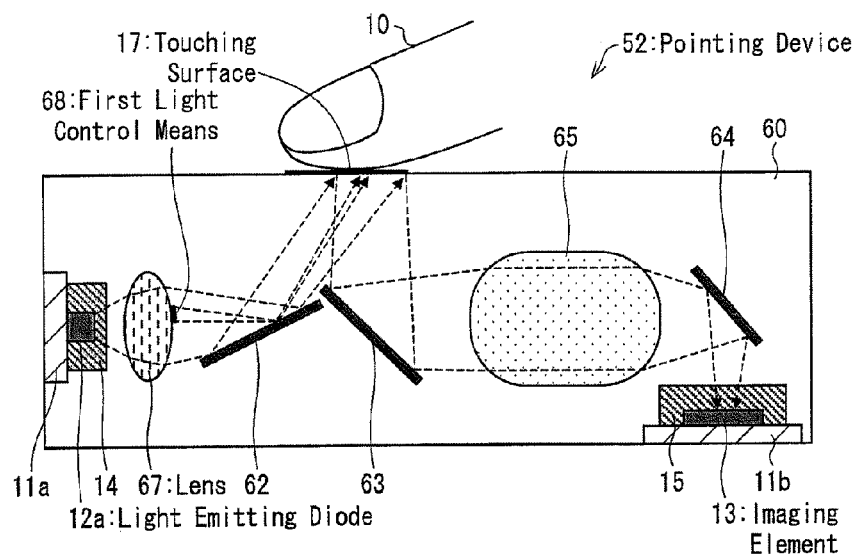
FIG. 25 is a cross sectional drawing showing a configuration of a pointing device in accordance with Thirteenth Embodiment of the present invention.

FIG. 25 is a cross sectional drawing showing a configuration example of the pointing device 52 of the present embodiment.

As shown in FIG. 25, the pointing device 52 of the present embodiment is obtained by arranging the pointing device 50 shown in FIG. 23 explained in Embodiment 11 to exclude the first light control means 61 and additionally include a lens 67 (optical component) and first light control means 68.

The lens 67 is positioned between the light emitting diode 12a and the reflective mirror 62 in the illuminating optical system, and converges light emitted from the light emitting diode 12a onto the reflective mirror 62. The reflective mirror 62 reflects the light from the lens 67 so that the light is incident to the touching surface 17. The first light control means 68 is provided at a light exiting side of the lens 67. The first light control means 68 is made of a light absorbing material, and absorbs light reaching the first light control means 68.

In the pointing device 52, the first light control means 68 absorbs light, thereby efficiently equating light intensity on the touching surface 17. The lens 67 is not limited to one which converges light. Alternatively, the lens 67 may be one which diffuses light.

Embodiment 14

Figure 26:
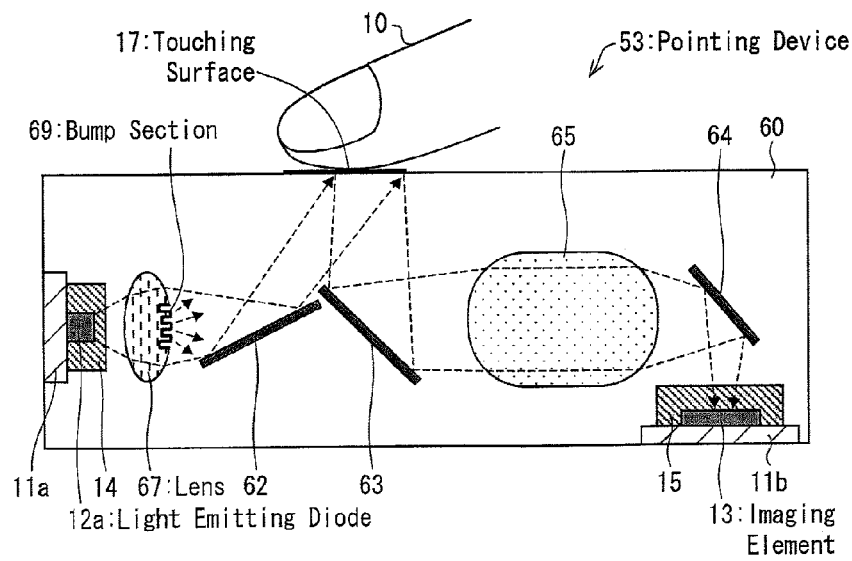
FIG. 26 is a cross sectional drawing showing a configuration of a pointing device in accordance with Fourteenth Embodiment of the present invention.

FIG. 26 is a cross sectional drawing showing a configuration example of a pointing device 53 of the present embodiment.

As shown in FIG. 26, the pointing device 53 of the present embodiment is obtained by arranging the pointing device 50 shown in FIG. 23 explained in Embodiment 11 to exclude the first light control means 61 and additionally include a lens 67 (optical component) with a bump section 69 (first light control means).

The lens 67 is positioned between the light emitting diode 12a and the reflective mirror 62 in the illuminating optical system, and converges light emitted from the light emitting diode 12a onto the reflective mirror 62. The reflective mirror 62 reflects the light from the lens 67 so that the light is incident to the touching surface 17.

The bump section 69 has a bump structure in which concavities and convexities are repeated periodically, and diffuses light reaching the bump section 69. The bump section 69 is provided at a light exiting side of the lens 67. Since an interface between the lens 67 and an internal space of the pointing device 53 has concavities and convexities, it is possible to diffuse light exiting from the lens 67. Concavities and convexities of the bump section 69 may be varied appropriately in order to obtain a required diffusing effect. Since the bump section 69 is directly formed in the lens 67, it is most appropriate that the lens 67 is made of resin.

In the pointing device 53, since the bump section 69 is provided in the lens 67, light is diffused, so that light intensity on the touching surface 17 is efficiently equated. Accordingly, there is no area where light is lost, such as a light absorbing material and a light reflective material. This allows the pointing device 53 to realize low power consumption.

Embodiment 15

Figure 27:
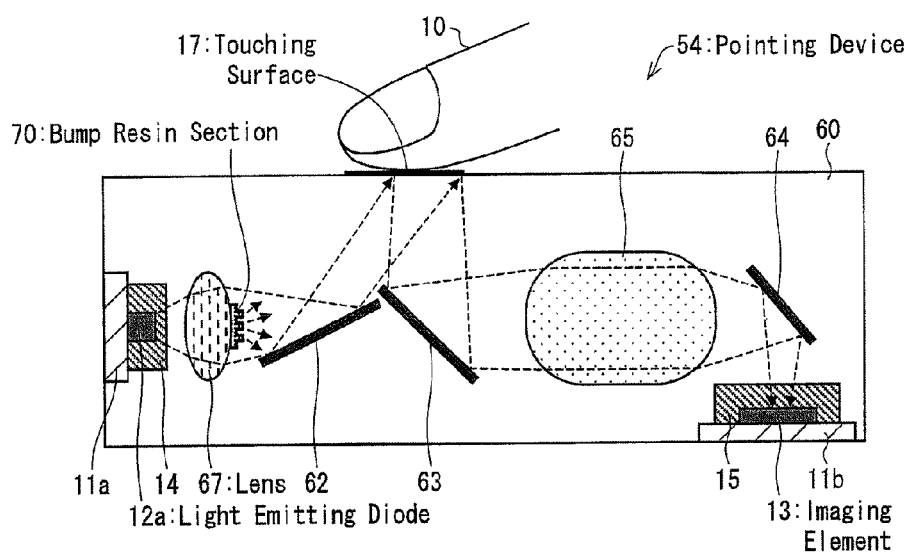
FIG. 27 is a cross sectional drawing showing a configuration of a pointing device in accordance with Fifteenth Embodiment of the present invention.

FIG. 27 is a cross sectional drawing showing a configuration example of a pointing device 54 of the present embodiment.

As shown in FIG. 27, the pointing device 54 of the present embodiment is obtained by arranging the pointing device 50 shown in FIG. 23 explained in Embodiment 11 to exclude the first light control means 61 and additionally include the lens 67 (optical component) and a bump resin section 70 (first light control means, second resin section).

The lens 67 is positioned between the light emitting diode 12a and the reflective mirror 62 in the illuminating optical system, and converges light emitted from the light emitting diode 12a onto the reflective mirror 62. The reflective mirror 62 reflects the light from the lens 67 so that the light is incident to the touching surface 17.

The bump resin section 70 has a bump structure in which concavities and convexities are repeated periodically, and diffuses light reaching the bump resin section 70. The bump resin section 70 is provided at a light exiting side of the lens 67. Since an interface between the bump resin section 70 and an internal space of the pointing device 54 has concavities and convexities, it is possible to diffuse light exiting from the bump resin section 70. Concavities and convexities of the bump resin section 70 may be varied appropriately in order to obtain a required diffusing effect. Since the bump resin section 70 diffuses light emitted from the lens 67, it is most appropriate that the bump resin section 70 is made of light-transmitting resin.

In the pointing device 54, since the bump resin section 70 is provided in the lens 67, light is diffused, so that light intensity on the touching surface 17 is efficiently equated. Accordingly, there is no area where light is lost, such as a light absorbing material and a light reflective material. This allows the pointing device 54 to realize low power consumption.

Embodiment 16

In Embodiments 1 to 15 as above, a member for equating distribution of light intensity on the touching surface 17 (first light control means) is provided in one member. Alternatively, the member for equating distribution of light intensity on the touching surface 17 may be provided in a plurality of members. For example, the configuration shown in FIG. 8 and the configuration shown in FIG. 16 may be combined with each other.

The first light control means controls light reaching the touching surface 17 by reflecting, absorbing, and diffusing light so that light emitted from the light emitting element is evenly incident to the touching surface 17. The first light control means may have any one of a light reflecting function, a light absorbing function, and a light diffusing function, and these functions may be selected so as to yield an effective effect according to where the light control means is provided. For example, when the light reflecting function is required, the first light control means is made of a light reflecting material. When the light absorbing function, the first light control means is made of a light absorbing material. When the light diffusing function is requested, the first light control means is made of a light diffusing material (e.g. bump structure, filler-mixing structure, lens structure, and a curved structure).

Further, in FIG. 18, the bump section 33 is formed in the resin mold section 14 (first resin section). Alternatively, a resin section (second resin section) having the same shape as that of the bump section 33 is provided in the illuminating system, such as the inclined surface 19 of the cover section 16 and the reflective mirror 62 of FIG. 23. In particular, it is possible to directly form the same shape as the bump section 33 in the inclined surface 19 of the cover section 16 which is made of resin. the same shape as the bump section 33 encompasses a bump shape in which satin concavities and convexities are provided.

As a component having the same function as that of the filler-containing resin mold section 34 shown in FIG. 20 or the lens section 36 formed in the resin mold section 14 shown in FIG. 21, there may be provided, in the illuminating optical system, a resin section to which filler is added (third resin section), a lens for diffusing light, or a resin section on which surface a curved lens section is provided (fourth resin section).

Embodiment 17

In the present embodiment, an explanation is made as to an electronic apparatus including any one of the pointing devices 40 to 54 explained in Embodiments 1 to 16 above. Examples of the electronic apparatus include various electronic apparatuses having an input device via which a user enters a desired operation, such as portable phones, PCs (mobile PCs in particular), PDAs, game machines, remote controls for TV, and microwave ovens. In the present embodiment, an explanation is made as to a case of portable phones.

Figure 28:
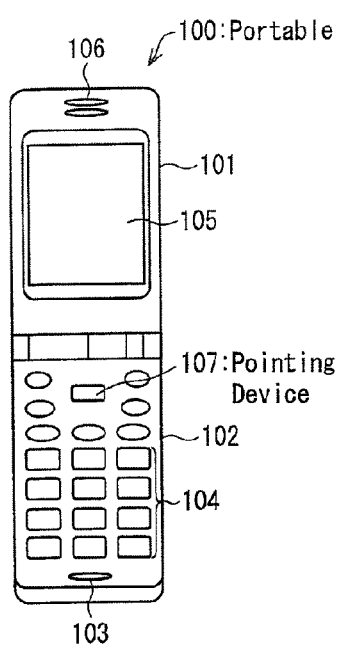
FIG. 28(a) is a drawing showing a front of an electronic apparatus in accordance with an embodiment of the present invention.
FIG. 28(b) is a drawing showing the electronic apparatus seen from a back face thereof.
FIG. 28(c) is a drawing showing the electronic apparatus seen from a side face thereof.
Figure 28:
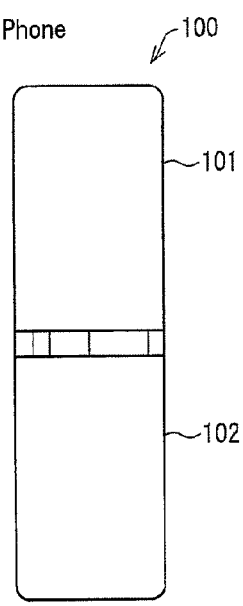
Figure 28:
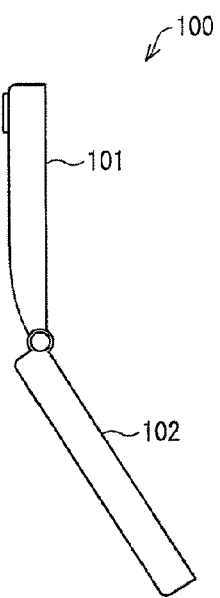

FIG. 28(*a*) is a drawing showing a front outlook of a portable phone 100 including a pointing device 107. FIG. 28(*b*) is a drawing showing a rear outlook of the portable phone 100. FIG. 28(*c*) is a drawing showing a side outlook of the portable phone 100.

As shown in FIGS. 28(*a*) to 28(*c*), the portable phone 100 (portable information terminal) of the present embodiment includes a monitor-side housing 101, an operation-side housing 102, a microphone section 103, ten keys 104, a monitor section 105, a speaker section 106, and a pointing device 107.

The monitor-side housing 101 and the operation-side housing 102 are connected with each other via a hinge. The portable phone 100 is a so-called folding-type portable phone. The microphone section 103 inputs audio information to the portable phone 100. The ten keys 104 are buttons via which numerals and characters are inputted. The monitor section 105 outputs visual information and displays information inputted from the pointing device 107. The speaker section 106 outputs audio information to the outside.

The pointing device 107 is an input device via which a user inputs a desired operation. The pointing devices 40 to 54 explained in Embodiments 1 to 16 may be used as the pointing device 107. In the present embodiment, as shown in FIG. 28(*a*), the pointing device 107 is positioned above the ten keys 104, but the position and the direction of the pointing device 107 are not limited to this.

In the present embodiment, an explanation has been made as to a case where the portable phone 100 is a folding-type portable phone. The portable phone 100 is not limited to a folding-type portable phone. Recently, the folding-type portable phones are dominant, and there appears a portable phone whose thickness is 10 mm or less when it is folded. Therefore, in consideration of portability of portable phones, the thickness of the portable phones is a very important factor.

In the operation-side housing 102, members that determine the thickness of the operation-side housing 102 include, aside from an internal circuit substrate (not shown), the microphone section 103, the ten keys 104, and the pointing device 107. Among them, the pointing device 107 has the largest thickness. Accordingly, making the pointing device 107 thin directly leads to making the portable phone 100 thin, and is very important.

As described above, the first light control means makes equipartition of light of a light emitting element whose output is deviated, and the second light control means blocks stray light. Therefore, it is possible to realize the pointing device 107 which is small and thin and consumes low power. Accordingly, providing the portable phone 100 with the pointing device 107 allows the portable phone 100 to have a thin and compact body and to realize low power consumption.

The present invention is not limited to the description of the embodiments above, but may be altered by a skilled person within the scope of the claims. An embodiment based on a proper combination of technical means disclosed in different embodiments is encompassed in the technical scope of the present invention.

A pointing device of the present invention includes: a touching surface on which an object is placed; a light emitting element for illuminating the touching surface from a side opposite to a side where the object is placed; and an imaging element for receiving light reflected from the object, the pointing device further comprising first light control means for controlling light which is emitted from the light emitting element and reaches the touching surface so that the light is evenly incident to the touching surface, the light emitting element emitting light whose light intensity is deviated with respect to a radiation angle, and the first light control means being positioned on a light path from the light emitting element to the touching surface.

It is preferable to arrange the pointing device of the present invention so as to further include second light control means for blocking light which does not contribute to illumination of the touching surface out of the light emitted from the light emitting element.

With the arrangement, it is possible to block stray light coming from the light emitting element. Since the stray light is prevented from being incident to the imaging element, it is possible to avoid malfunction of the pointing device due to the stray light.

It is preferable to arrange the pointing device of the present invention such that the light emitting element is a light emitting diode.

With the arrangement, the light emitting diode with small deviation of light intensity with respect to a radiation angle is used. This allows yielding the effect yielded by the first light control means in a shorter distance. This allows the pointing device to be thin in particular.

It is preferable to arrange the pointing device of the present invention such that the first light control means is provided in the light emitting element.

With the arrangement, the first light control means is provided on the light emitting element. Accordingly, it is possible to make emission profile best suitable for making light intensity on the touching surface even. Further, a configuration of a conventional pointing device can be used only with change in the light emitting element.

It is preferable to arrange the pointing device of the present invention such that the light emitting element has a rectangular parallelepiped shape whose top surface and bottom surface are parallel to each other, and the top surface faces the touching surface, and the first light control means is provided on the top surface of the light emitting element in such a manner as to be on an area including a center of the top surface.

With the arrangement, the first light control means is provided on the top surface of the light emitting element in such a manner as to be on an area including a center of the top surface where light intensity is particularly high. This allows the first light control means to be positioned on a small location.

It is preferable to arrange the pointing device of the present invention such that the light emitting element is covered with a first resin section, and the first light control means is provided in at least a part of the first resin section.

With the arrangement, the first light control means is provided in the first resin section covering the light emitting element. Accordingly, it is possible to obtain a light control effect while maintaining a configuration of a conventional pointing device in terms of key devices such as a light emitting element and a component cover.

It is preferable to arrange the pointing device of the present invention such that the light emitting element has a rectangular parallelepiped shape whose top surface and bottom surface are parallel to each other, and the top surface faces the touching surface, and the first light control means is provided on a surface of the first resin section in such a manner as to be on an area including a normal axis passing through a center of the top surface of the light emitting element.

With the arrangement, the first light control means is provided on a surface of the first resin section in such a manner as to be on an area including a normal axis passing through a center of the top surface of the light emitting element. This allows the first light control means to be positioned on a small location.

It is preferable to arrange the pointing device of the present invention so as to further include an optical component, provided on a light path from the light emitting element to the touching surface, for guiding light emitted from the light emitting element toward the touching surface, the first light control means being provided in the optical component.

With the arrangement, when the first light control means is produced in a process for producing a light control function of an optical component, it is possible to subdue increases in the number of components and costs due to provision of the first light control means. Accordingly, this configuration is particularly applicable to a pointing device including an optical component in the illuminating optical system.

It is preferable to arrange the pointing device of the present invention such that the optical component is a lens for converging light emitted from the light emitting element or a lens for diffusing light emitted from the light emitting element.

With the arrangement, the first light control means is provided in a lens for converging or diffusing lens. Accordingly, when the first light control means is produced in a process for producing an optical function of a lens, it is possible to subdue increases in the number of components and costs due to provision of the first light control means. Accordingly, this configuration is particularly applicable to a pointing device including a lens in the illuminating optical system. This configuration is particularly preferable for a case where the first light control means is advantageous for light diffusion.

It is preferable to arrange the pointing device of the present invention such that the optical component is a reflective mirror for reflecting light emitted from the light emitting element.

With the arrangement, the first light control means is provided in the reflective mirror having a reflecting function. Accordingly, when the first light control means is produced in a process for producing an optical function of a reflective mirror, it is possible to subdue increases in the number of components and costs due to provision of the first light control means. Accordingly, this configuration is particularly applicable to a pointing device including a reflective mirror in the illuminating optical system.

It is preferable to arrange the pointing device of the present invention such that a part of a reflective surface of the reflective mirror has a curved concave shape, and the first light control means has a structure including a curved concave reflective surface of the reflective mirror.

With the arrangement, the first light control means has a structure including a curved concave reflective surface of the reflective mirror. This yields an effect of diffusing light when reflecting light.

It is preferable to arrange the pointing device of the present invention so as to further include a housing including the light emitting element and the imaging element, the touching surface being provided on a surface of the housing which surface is exposed to an outside, the first light control means is provided on the housing in such a manner as to be on a side where the light emitting element and the imaging element are provided.

With the arrangement, the first light control means is provided on the housing. Accordingly, when the first light control means is produced in a process for producing an optical function of the housing, it is possible to subdue increases in the number of components and costs due to provision of the first light control means. Accordingly, this configuration is particularly applicable to a pointing device including a housing having an optical effect such as light reflection and light conversion.

It is preferable to arrange the pointing device of the present invention such that the first light control means reflects light emitted from the light emitting element.

With the arrangement, the first light control means serves as a light blocking section which reflects light and does not transmit light. Accordingly, by positioning the first light control means at a location with high light intensity, it is possible to subdue deviation of light intensity. Further, by reusing light reflected from the first light control means, it is possible to subdue loss of light. Accordingly, this configuration allows the pointing device to consume only low power.

It is preferable to arrange the pointing device of the present invention such that the first light control means is a metal film.

With the arrangement, light emitted from the light emitting element is reflected by a metal. Further, since a metal has high reflectance and is easy in adhesion and patterning, the metal serves as a light blocking material suitable for the first light control means.

it is preferable to arrange the pointing device of the present invention such that the first light control means is an electrode made of a metal film on the light emitting element, and reflects light emitted from the light emitting element.

With the arrangement, the first light control means made of a metal film can be easily obtained. Further, the first light control means can be produced by changing a mask used in forming an electrode pattern of the light emitting element, and accordingly a conventional process can be used. Further, a light output reflected and blocked by the electrode is outputted from an area other than the electrode, and accordingly loss of light is subdued.

It is preferable to arrange the pointing device of the present invention such that the first light control means absorbs light emitted from the light emitting element.

With the arrangement, the first light control means serves as a light blocking section which absorbs light and does not transmit light. Accordingly, by positioning the first light control means at a location having high light intensity, it is possible to subdue deviation of light intensity. Further, since light blocked by the first light control means is absorbed, it is possible to avoid stray light due to light reflection or light scattering. Accordingly, this configuration realizes a pointing device which does not suffer from a problem of stray light in particular.

It is preferable to arrange the pointing device of the present invention such that the first light control means diffuses light emitted from the light emitting element.

With the arrangement, the first light control means diffuses light. Accordingly, by positioning the first light control means at a location having high light intensity, it is possible to subdue deviation of light intensity. Further, since scattering of light at an area with high light intensity contributes to increasing light intensity at an area with low light intensity, it is possible to secure high light intensity in average. Accordingly, this configuration allows the pointing device to consume only low power in particular.

It is preferable to arrange the pointing device of the present invention such that the first light control means is designed such that an interface on the light path has a bump structure.

With the arrangement, the first light control means is designed such that an interface on the light path has a bump structure, which allows scattering light. Accordingly, this configuration does not require any additional optical components in particular.

It is preferable to arrange the pointing device of the present invention such that each of a difference between a convexity and a concavity, a width of the concavity, and a width of the convexity in the bump section is 10 μm or less.

With the arrangement, the first light control means has a minute bump structure of 10 μm or less, which is close to a wavelength of light emitted from the light emitting element. Consequently, it is possible to cause not only geometric scattering but also an optical scattering effect such as Mie scattering, thereby increasing effect of scattering.

It is preferable to arrange the pointing device of the present invention such that the first light control means is a second resin section whose surface has a bump structure including satin-like concavities and convexities.

With the arrangement, by subjecting a mold used in producing the second resin section to satin finish, it is possible to form satin-like concavities and convexities on the top surface of the second resin section. This allows easy production of the first light control means. Further, any shapes of concavities and convexities can be made by giving the shapes to the mold.

It is preferable to arrange the pointing device of the present invention such that the first light control means is a third resin section to which filler is added.

With the arrangement, by providing the third resin section to which filler is added, light emitted from the light emitting element can be scattered in resin. In this way, the first light control means can be produced easily.

It is preferable to arrange the pointing device of the present invention such that the filler is a particulate filling material whose diameter is 10 μm or less.

With the arrangement, the filler is a material whose diameter is 10 μm or less, which is close to a wavelength of light emitted from the light emitting element. Consequently, it is possible to cause not only geometric scattering but also an optical scattering effect such as Mie scattering, thereby increasing effect of scattering.

It is preferable to arrange the pointing device of the present invention such that the first light control means is a bump section formed on a surface of the first resin section, and diffuses light emitted from the light emitting element.

It is preferable to arrange the pointing device of the present invention such that filler is added to the first resin section, and the first light control means is the first resin section to which filler is added, and diffuses light emitted from the light emitting element.

It is preferable to arrange the pointing device of the present invention such that the optical component is made of resin, and the first optical control means is a bump section formed on a surface of the optical component, and diffuses light emitted from the light emitting element.

It is preferable to arrange the pointing device of the present invention such that the housing is made of resin, and the first light control means is a bump section provided on the housing in such a manner as to be on a side where the light emitting element and the imaging element are provided, and the first light control means diffuses light emitted from the light emitting element.

It is preferable to arrange the pointing device of the present invention such that the first light control means is a lens for diffusing light emitted from the light emitting element.

With the arrangement, the first light control means made of a lens allows yielding a light scattering effect due to refraction of light at an interface.

It is preferable to arrange the pointing device of the present invention such that the first light control means is a fourth resin section on a surface of which a curved lens section is provided.

With the arrangement, by designing a mold used in producing the fourth resin section to have a curved surface, it is possible to form a curved lens section on the surface of the fourth resin section. Thus, it is possible to easily produce the first light control means.

The pointing device of the present invention is arranged such that the first light control means is a lens for diffusing light emitted from the light emitting element, and the lens is a curved surface of the first resin section.

With the arrangement, by providing a lens structure on the surface of the first resin section, it is possible to diffuse light reaching the lens structure. Further, the lens structure on the surface of the first resin section can be easily produced by designing a mold used in producing the second resin section to have a curved shape and transferring the curved shape to the second resin section.

It is preferable to arrange the pointing device of the present invention so as to further include: a first resin section for covering the light emitting element; and a housing including the light emitting element and the imaging element, the touching surface being provided on a surface of the housing which surface exposed to an outside, the first light control means being provided in at least two selected from the group consisting of the light emitting element, at least a part of the first resin section, and a side of the housing on which side the light emitting element and the imaging element are provided.

It is preferable to arrange the pointing device of the present invention such that the light emitting element is covered with a first resin section, and the second light control means is provided in the first resin section.

With the arrangement, the second light control means is provided in the first resin section, and therefore is positioned close to the light emitting element. Consequently, it is possible to downsize an area where the second light control means is provided. This contributes to avoiding growth in size of the pointing device.

It is preferable to arrange the pointing device of the present invention so as to further include a housing including the light emitting element and the imaging element, the touching surface being provided on a surface of the housing which surface exposed to an outside, the second light control means being provided on the housing.

With the arrangement, since the second light control means is provided on the housing, the second light control means can be produced in a process for producing an optical function in the housing. Therefore, this configuration is applicable to a pointing device having a housing with an optical effect such as light reflection and light conversion in particular.

It is preferable to arrange the pointing device of the present invention such that the second light control means absorbs light emitted from the light emitting element.

With the arrangement, the second light control means has a function of absorbing light emitted from the light emitting element, and therefore serves as a light blocking section which does not transmit light. Further, since the light blocked by the second light control means is absorbed by the second light control means, it is possible to avoid stray light resulting from light reflection or light scattering.

INDUSTRIAL APPLICABILITY

The present invention is applicable not only to the field of a pointing device capable of detecting the movement of an object such as a fingertip, but also to the field relating to a method for producing a pointing device, in particular a method for fabricating a pointing device, and further to the field of an electronic apparatus including the pointing device.

REFERENCE SIGNS LIST

10. Fingertip (object)
11, 11a, 11b. Circuit substrate
12. Light source (light emitting element)
12a. Light emitting diode (light emitting element)
12b. Laser diode (light emitting element)
13. Imaging element
14. Resin mold section (first resin section)
15. Resin mold section
16. Cover section (housing)
17. Touching surface
18. Prism
19. Inclined surface
20, 24. Reflective lens
21, 22. Reflective surface
23. Diffraction element
31, 31a, 31b, 31c. First light control means
32, 32a. Second light control means
33, 33a. Bump section (first light control means)
34. Filler-containing resin mold section (first light control means)
35. Filler
36. Lens section (first light control means)
37. Curved concave section (first light control means)
40-54. Pointing device
60. Housing
61. First light control means
62. Reflective mirror (optical component)
63, 64. Reflective mirror
65. Wave guide tube
66. Curved reflective mirror 67. Lens (optical component)
68. First light control means
69. Bump section (first light control means)
70. Bump resin section (first light control means, second resin section)
100. Portable phone (electronic apparatus)
101. Monitor-side housing
102. Operation-side housing
104. Ten keys
107. Pointing device

The invention claimed is:

1. A pointing device, comprising:
   a touching surface on which an object is placed;
   a light emitting element for illuminating the touching surface from a side opposite to a side where the object is placed; and
   an imaging element for receiving light reflected from the object, the pointing device further comprising a first light control part subduing a deviation in a distribution of a light intensity on the touching surface by controlling light which is emitted from the light emitting element and reaches the touching surface, and a second light control part absorbing light which does not contribute to illumination of the touching surface out of the light emitted from the light emitting element;
   the light emitting element emitting light whose light intensity is deviated with respect to a radiation angle, and
   the first light control part and the second light control part being positioned on a light path from the light emitting element to the touching surface, wherein the light emitting element is covered with a first resin section, the first light control part is provided on a first surface of the first resin section, and the first light control part diffuses light emitted from the light emitting element and is designed such that an interface on the light path has a bump structure, the bump structure having concavities and convexities repeated periodically which scatter light reaching the bump structure, and the second light control part is provided on a second surface of the first resin section.

2. The pointing device as set forth in claim 1, wherein the light emitting element is a light emitting diode.

3. The pointing device as set forth in claim 1, wherein
   the light emitting element has a rectangular parallelepiped shape whose top surface and bottom surface are parallel to each other, and the top surface faces the touching surface, and
   the first light control part is provided on a surface of the first resin section in such a manner as to be on an area including a normal axis passing through a center of the top surface of the light emitting element.

4. The pointing device as set forth in claim 1, further comprising a housing including the light emitting element and the imaging element, the touching surface being provided on a surface of the housing which surface is exposed to an outside,
   the first light control part is provided on the housing in such a manner as to be on a side where the light emitting element and the imaging element are provided.

5. The pointing device as set forth in claim 1, wherein each of a difference between a convexity and a concavity, a width of the concavity, and a width of the convexity in the bump section is 10 μm or less.

6. The pointing device as set forth in claim 1, wherein the first light control part is a second resin section whose surface has a bump structure including satin-like concavities and convexities.

7. The pointing device as set forth in claim 1, further comprising:
   the first light control part being provided in at least the light emitting element.

8. An electronic apparatus comprising a pointing device as an input device,
   the pointing device comprising:
   a touching surface on which an object is placed;
   a light emitting element for illuminating the touching surface from a side opposite to a side where the object is placed;
   an imaging element for receiving light reflected from the object; and
   a first light control part subduing a deviation in a distribution of a light intensity on the touching surface by controlling light which is emitted from the light emitting element and reaches the touching surface, and a second light control part absorbing light which does not contribute to illumination of the touching surface out of the light emitted from the light emitting element;
   the light emitting element emitting light whose light intensity is deviated with respect to a radiation angle, and
   the first light control part and a second light control part being positioned on a light path from the light emitting element to the touching surface, wherein the light emitting element is covered with a first resin section, the first light control part is provided on a first surface of the first resin section, and the first light control part diffuses light emitted from the light emitting element and is designed such that an interface on the light path has a bump structure, the bump structure having concavities and convexities repeated periodically which scatter light reaching the bump structure, and the second light control part is provided on a second surface of the first resin section.

* * * * *